(12) United States Patent
Hirler et al.

(10) Patent No.: US 7,777,278 B2
(45) Date of Patent: Aug. 17, 2010

(54) LATERAL SEMICONDUCTOR COMPONENT WITH A DRIFT ZONE HAVING AT LEAST ONE FIELD ELECTRODE

(75) Inventors: Franz Hirler, Isen (DE); Armin Willmeroth, Augsburg (DE); Markus Schmitt, Neubiberg (DE); Carolin Tolksdorf, Steinhoering (DE); Gerald Deboy, Munich (DE); Ralf Henninger, Munich (DE); Uwe Wahl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 187 days.

(21) Appl. No.: 12/020,197

(22) Filed: Jan. 25, 2008

(65) Prior Publication Data
US 2008/0179672 A1  Jul. 31, 2008

Related U.S. Application Data

(62) Division of application No. 10/926,581, filed on Aug. 25, 2004, now abandoned.

(30) Foreign Application Priority Data
Aug. 27, 2003 (DE) ................. 103 39 488

(51) Int. Cl.
*H01L 21/336* (2006.01)
(52) U.S. Cl. ............ 257/367; 257/328; 257/335; 257/E29.027

(58) Field of Classification Search ............ 257/367
See application file for complete search history.

(56) References Cited

U.S. PATENT DOCUMENTS

| 4,941,026 | A | 7/1990 | Temple |
| 6,555,873 | B2 | 4/2003 | Disney et al. |
| 6,630,698 | B1 | 10/2003 | Deboy et al. |
| 6,717,230 | B2 | 4/2004 | Kocon |
| 6,815,293 | B2 | 11/2004 | Disney et al. |
| 2002/0096708 | A1* | 7/2002 | Ahlers et al. ........... 257/328 |

FOREIGN PATENT DOCUMENTS

| DE | 19954600 | 11/2000 |
| DE | 19958151 | 6/2001 |

\* cited by examiner

*Primary Examiner*—Kenneth A Parker
*Assistant Examiner*—Jose R Diaz
(74) *Attorney, Agent, or Firm*—Dicke, Billig & Czaja, PLLC

(57) ABSTRACT

A semiconductor component is described. In one embodiment, the semiconductor component includes a semiconductor body with a first side and a second side. A drift zone is provided, which is arranged in the semiconductor body below the first side and extends in a first lateral direction of the semiconductor body between a first and a second doped terminal zone. At least one field electrode is provided, which is arranged in the drift zone, extends into the drift zone proceeding from the first side and is configured in a manner electrically insulated from the semiconductor body.

20 Claims, 31 Drawing Sheets

FIG 1a
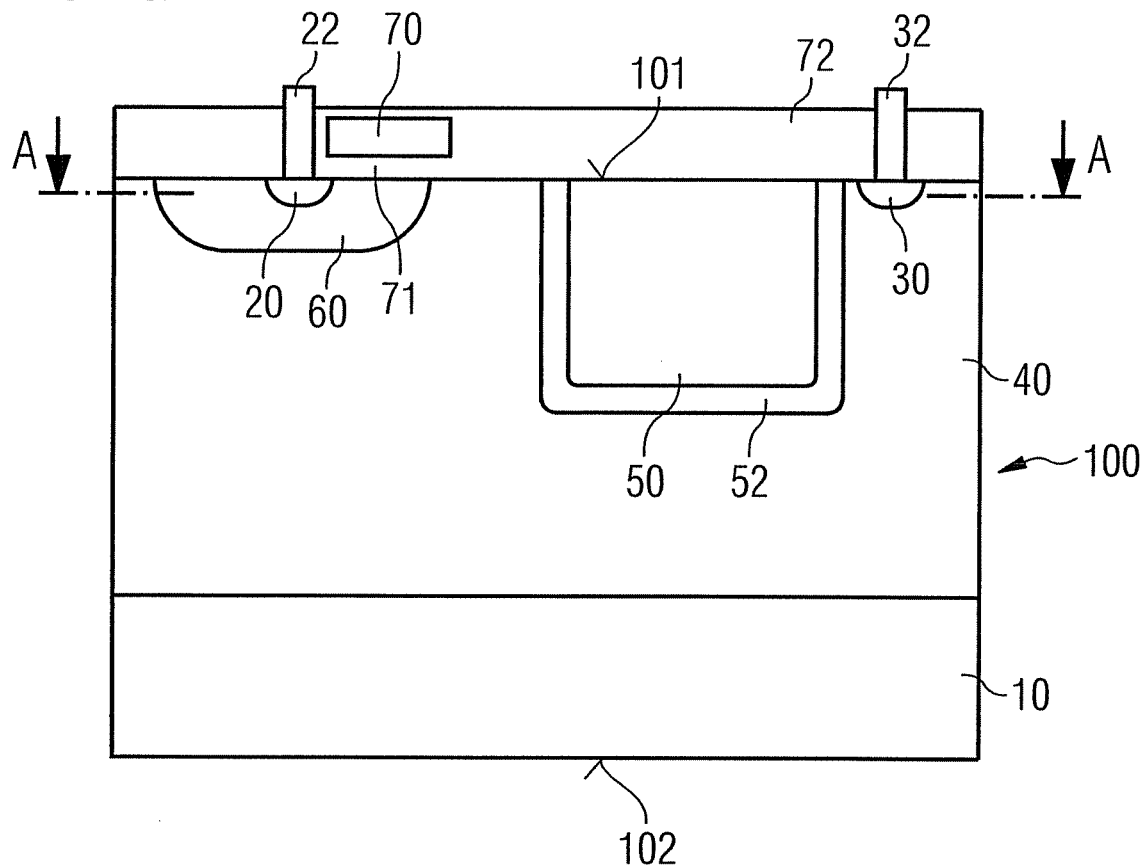
FIG 1b  A-A
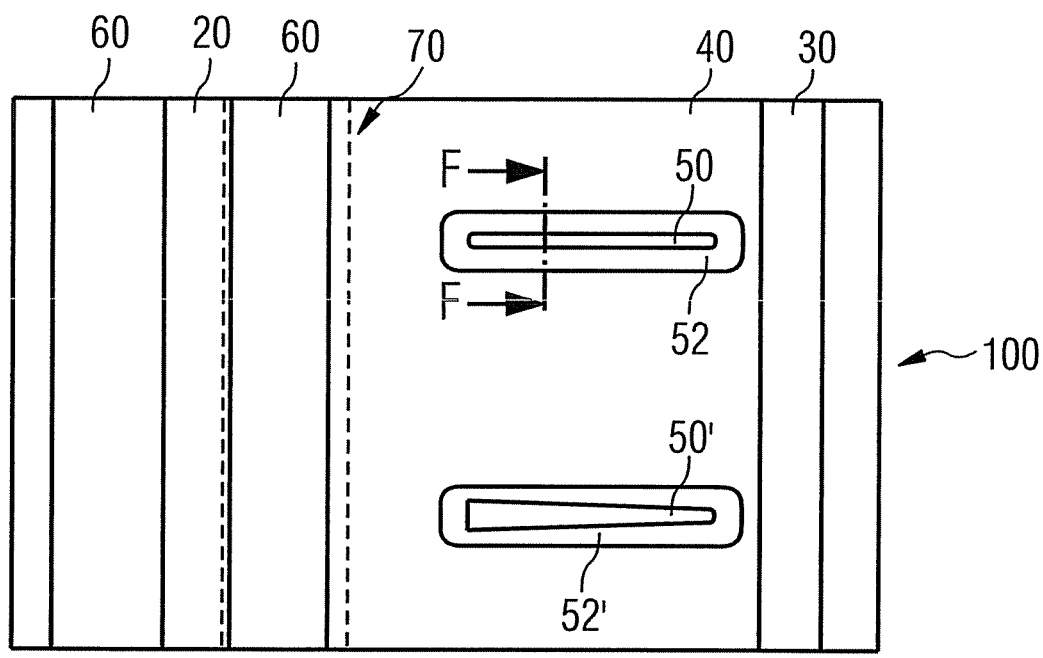

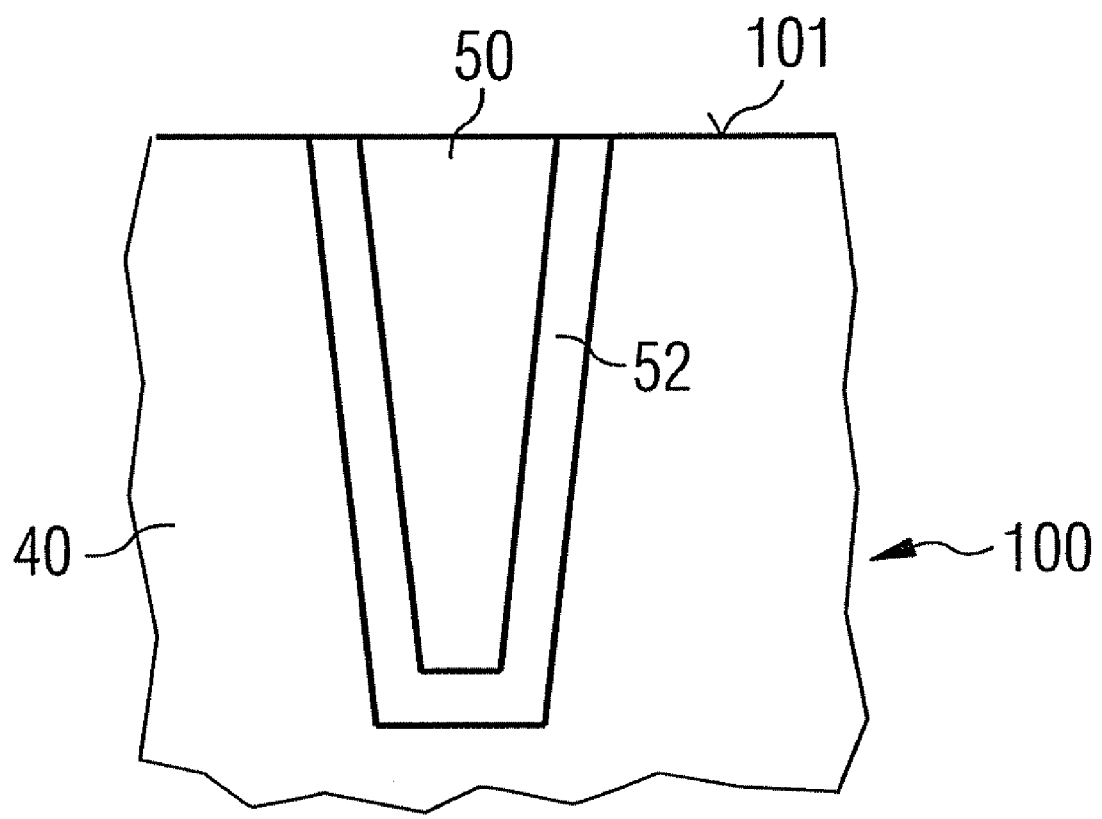
FIG 1c  F-F

FIG 2a
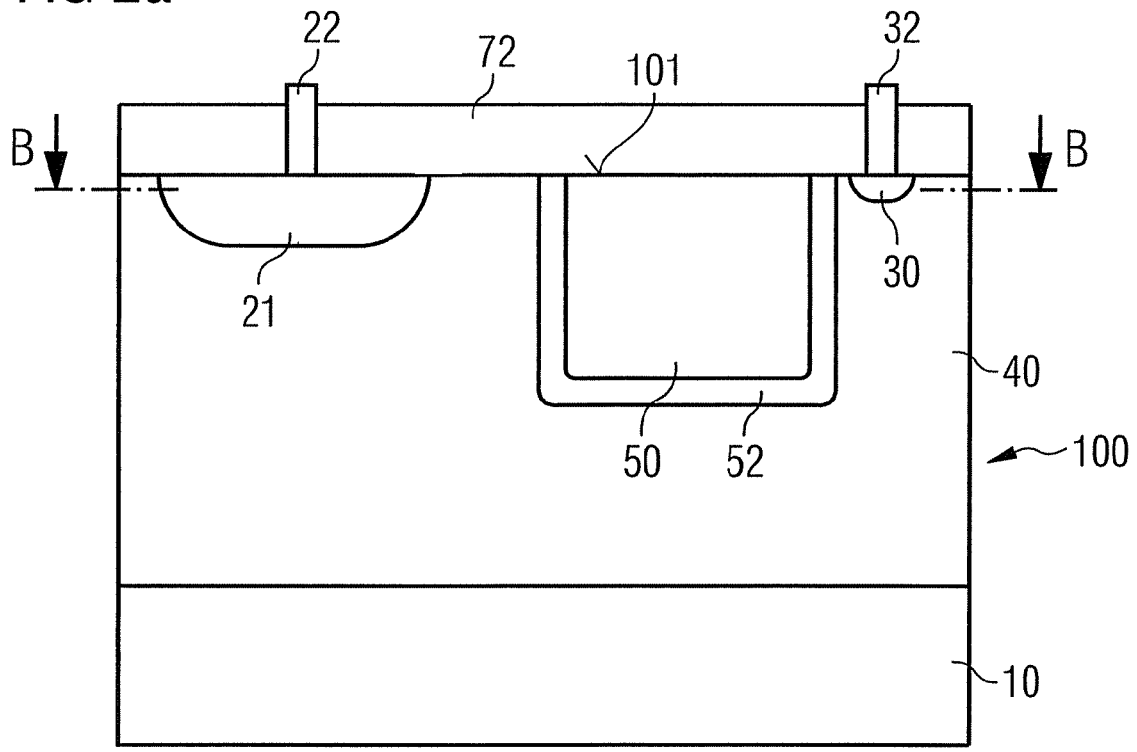
FIG 2b B-B
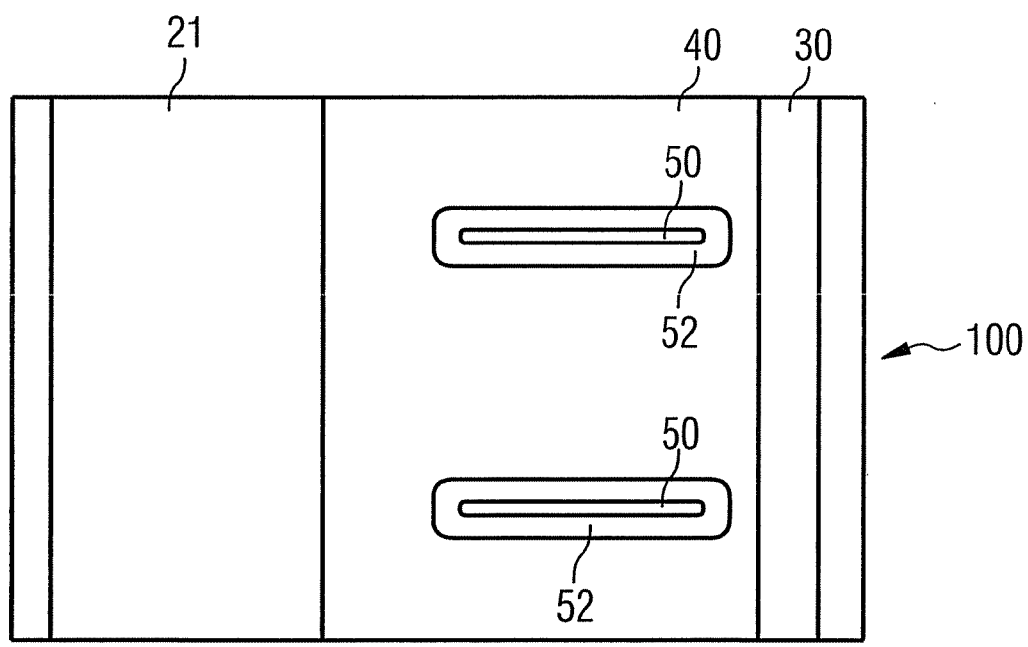

FIG 3a
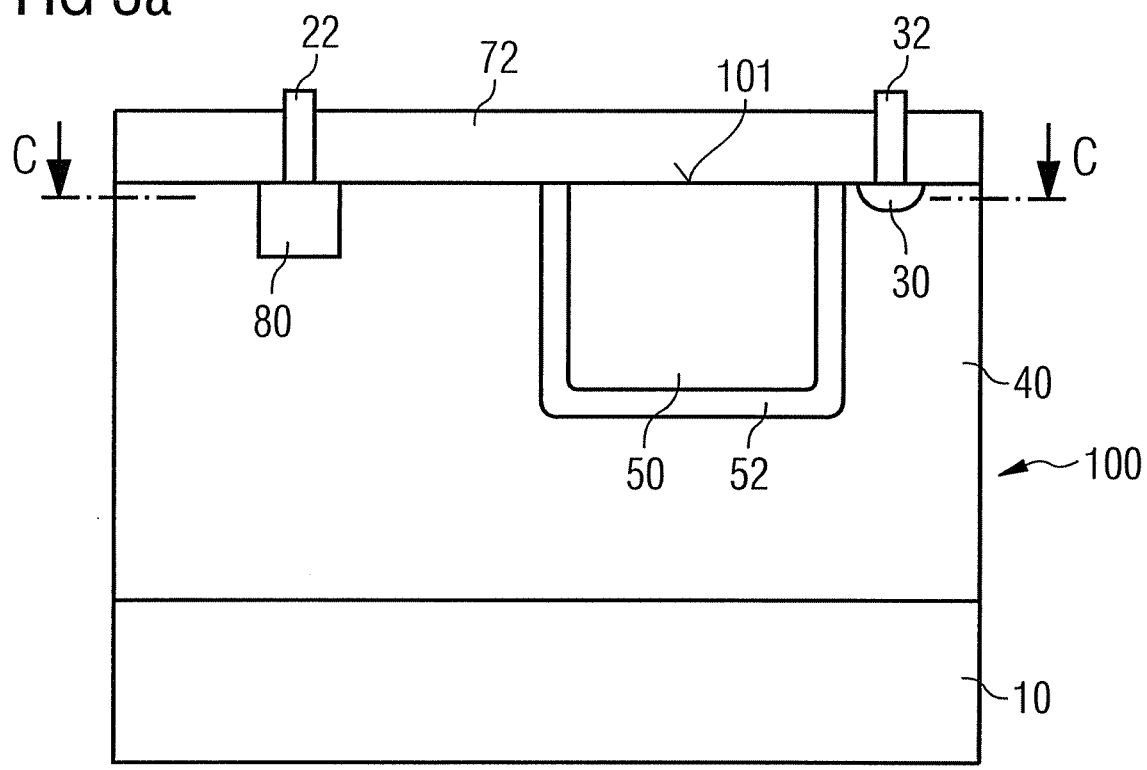
FIG 3b C-C
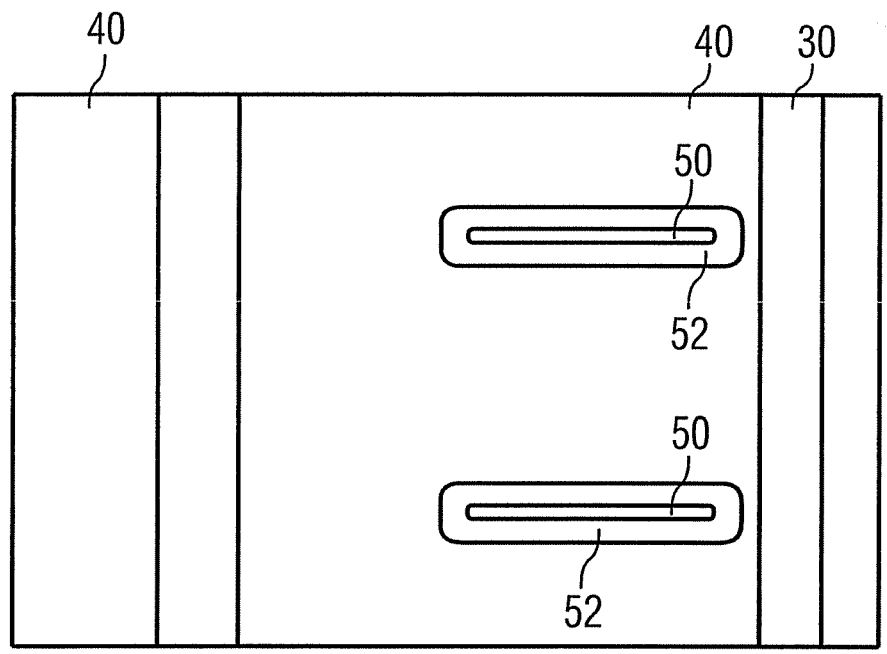

FIG 4a
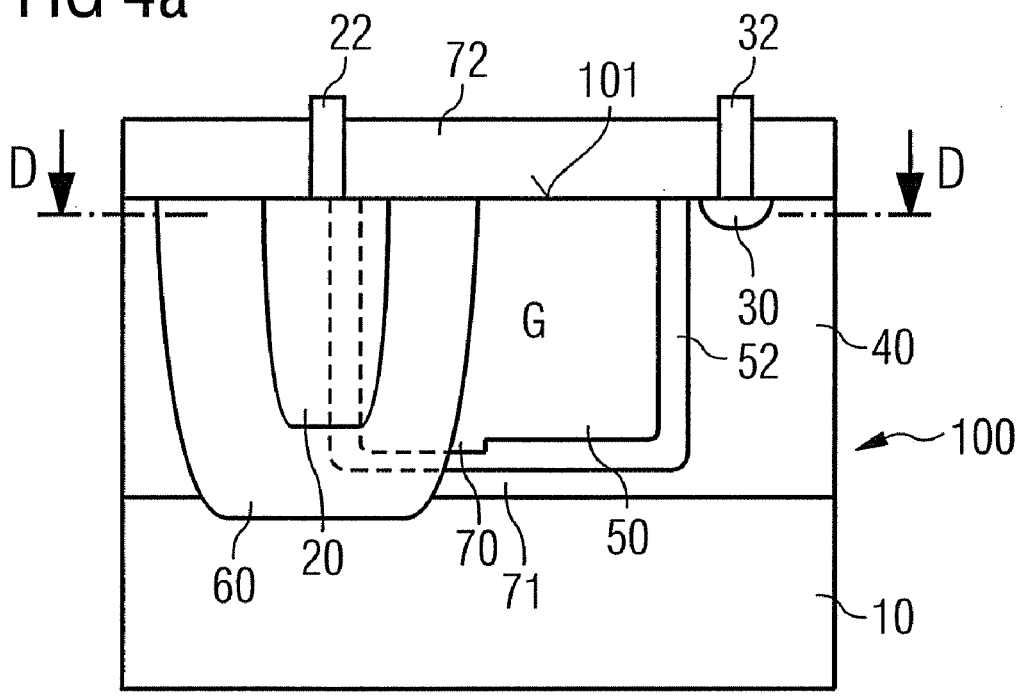
FIG 4b  D-D
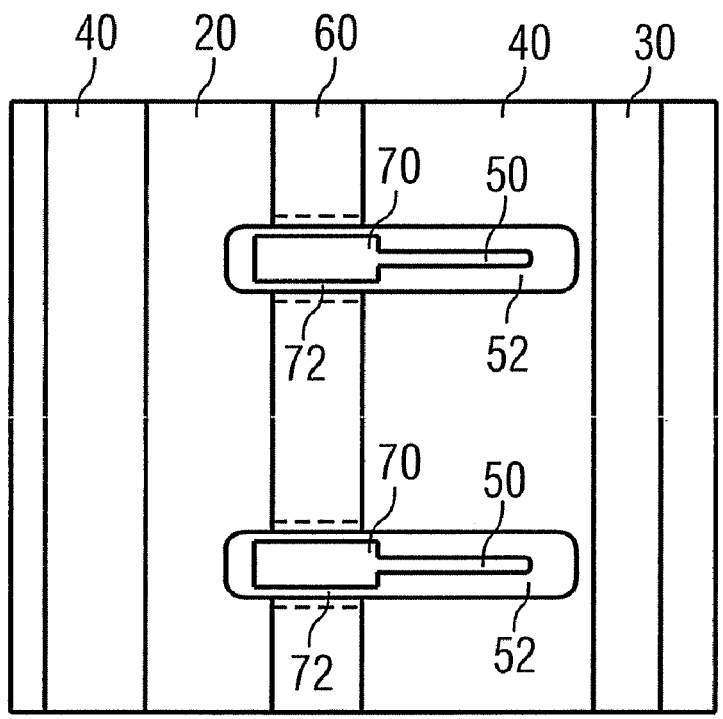

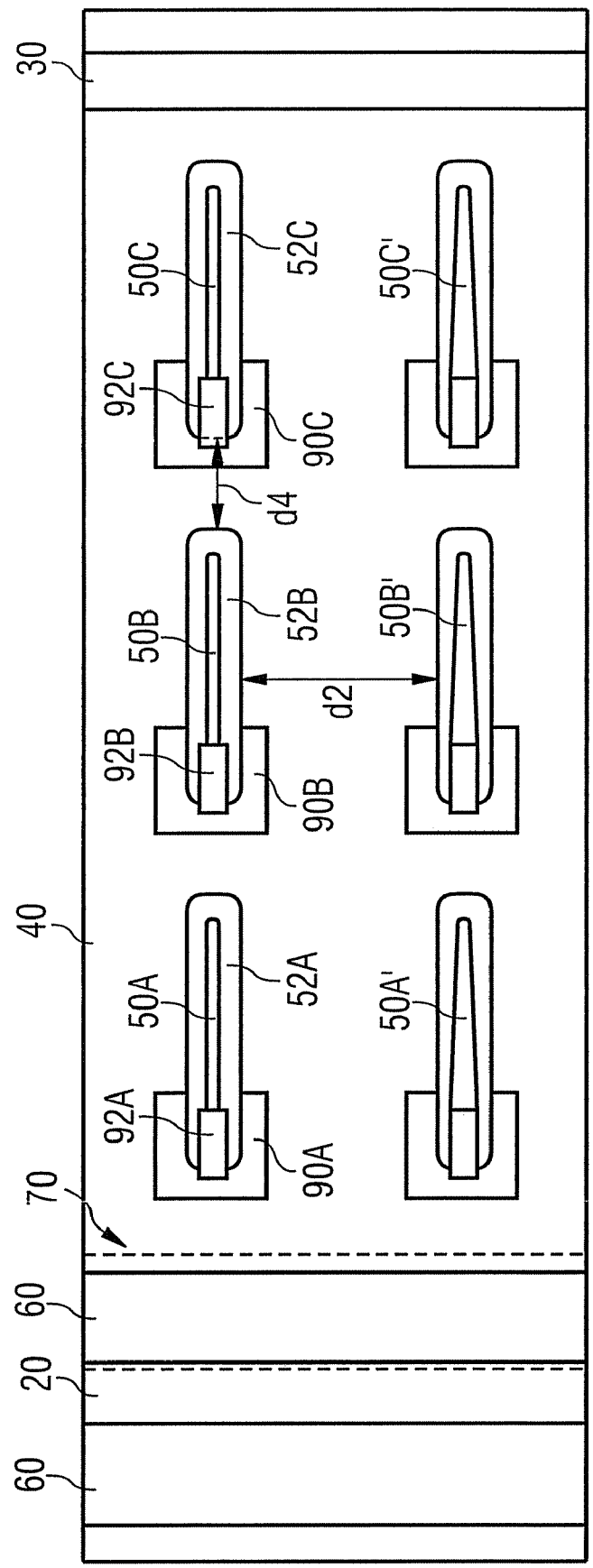
FIG 7b E-E

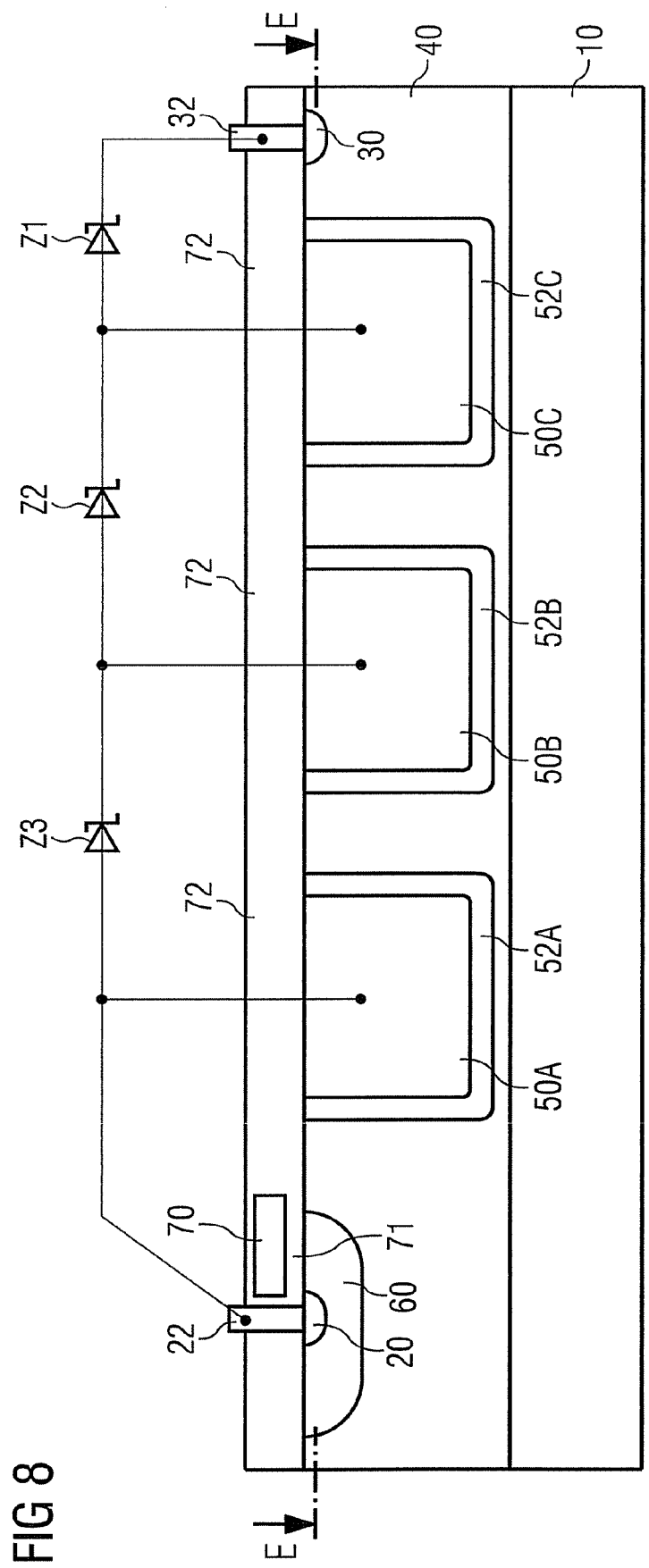

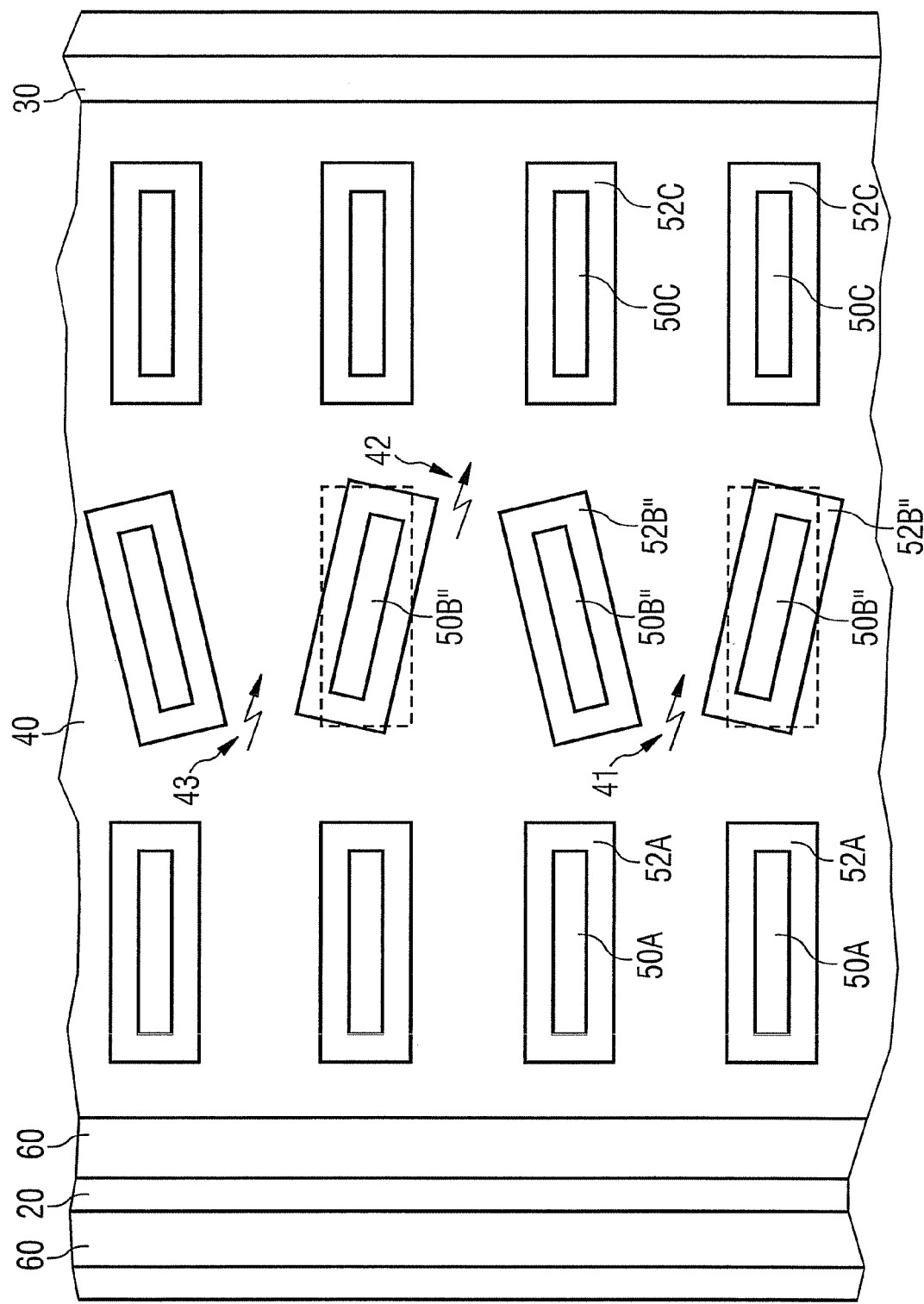

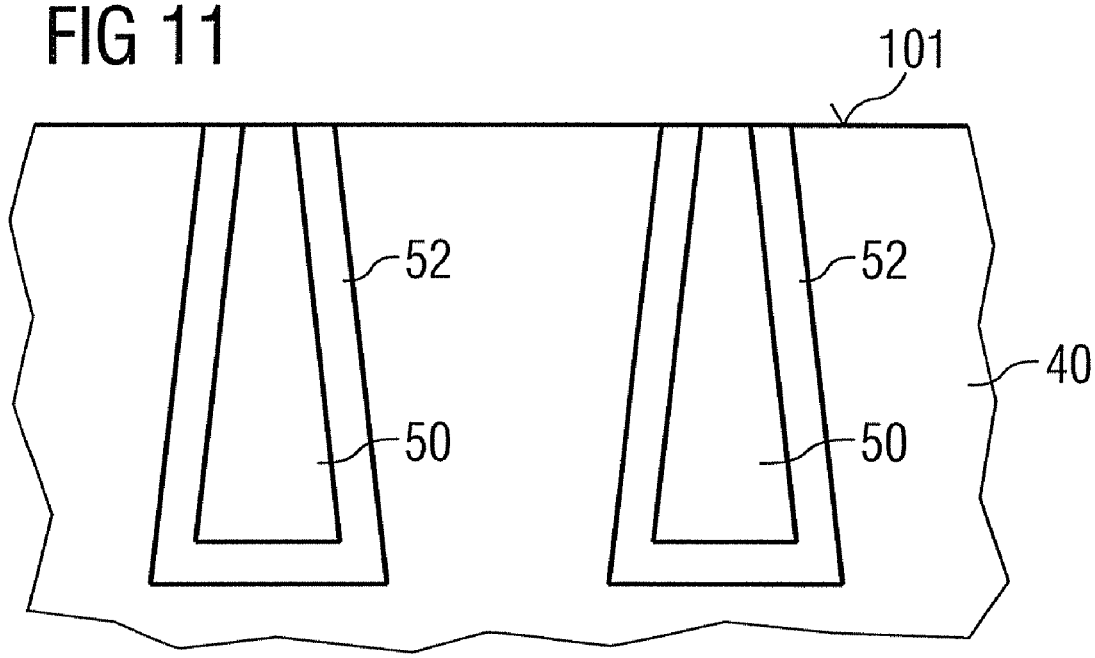
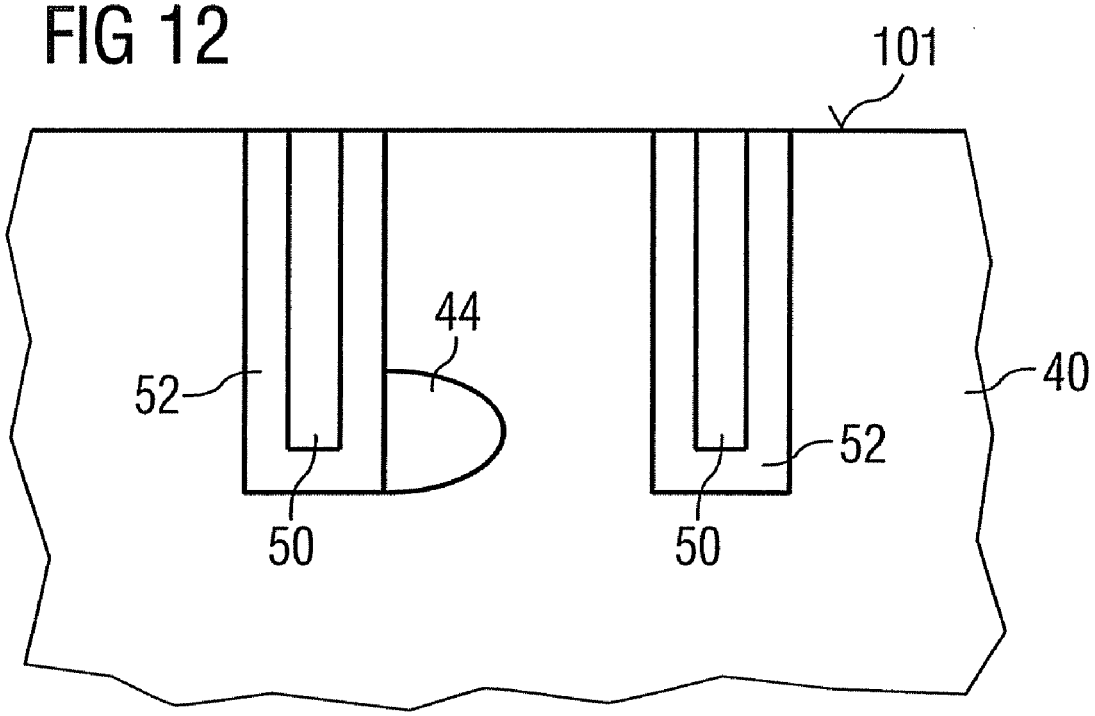

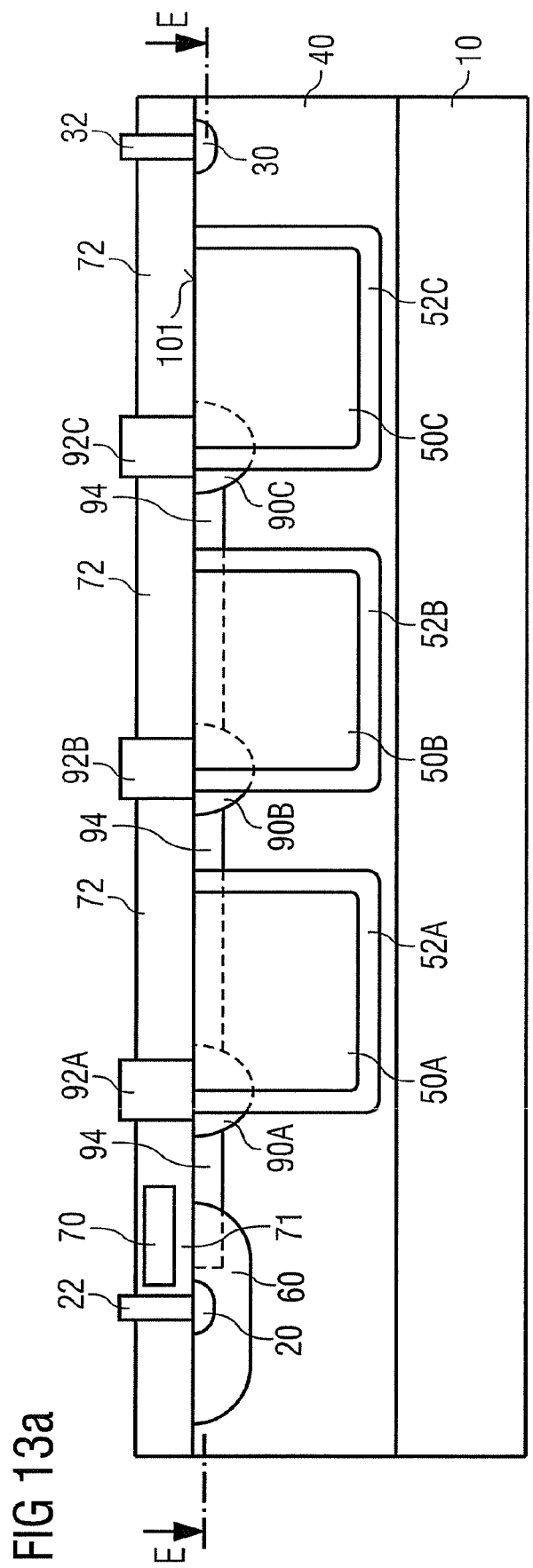

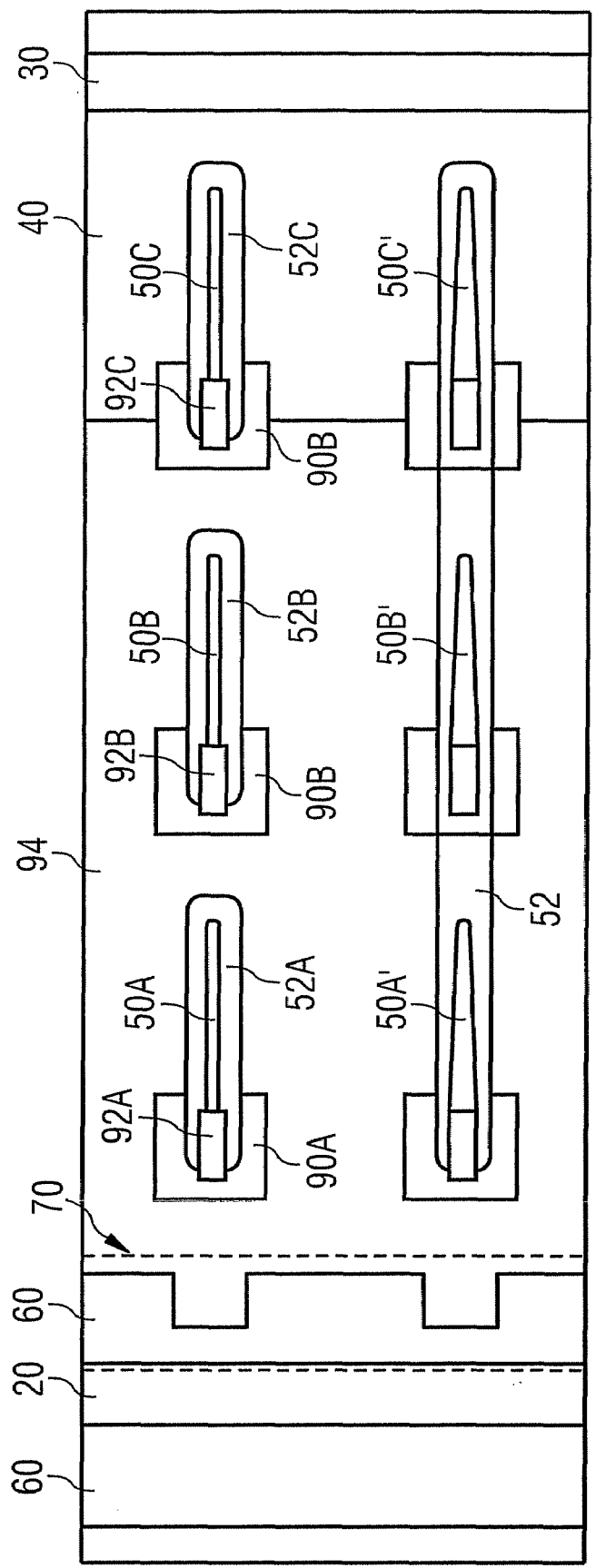
FIG 13b E-E

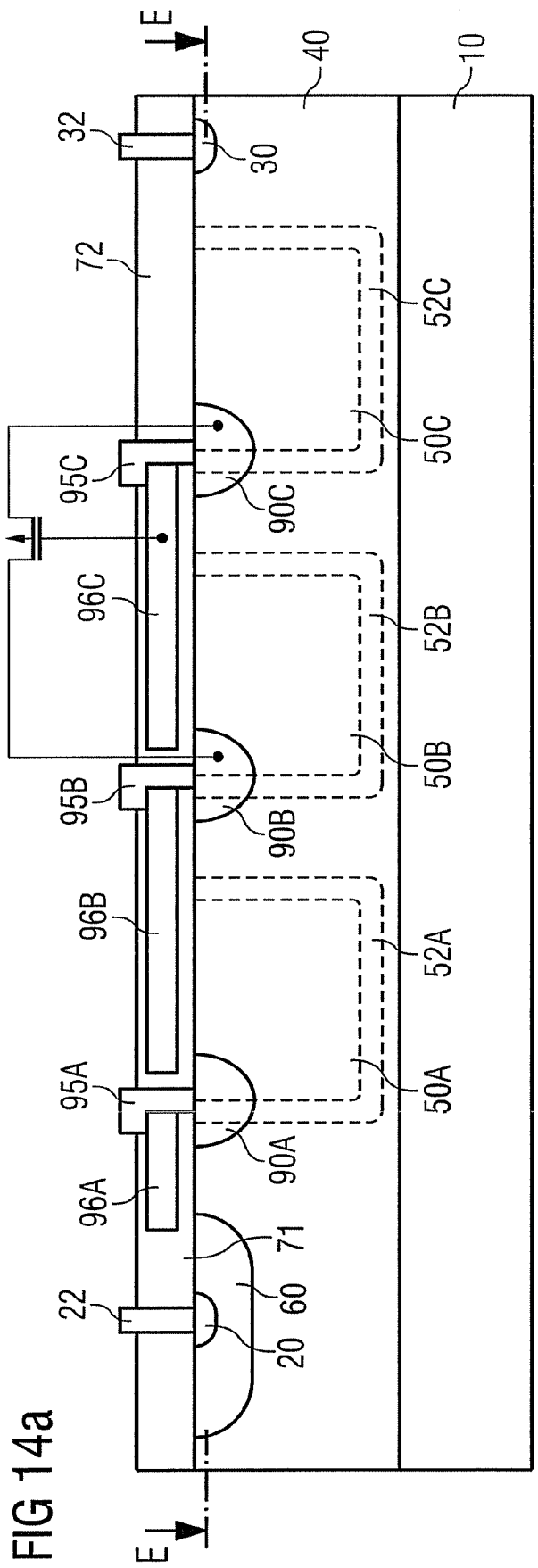

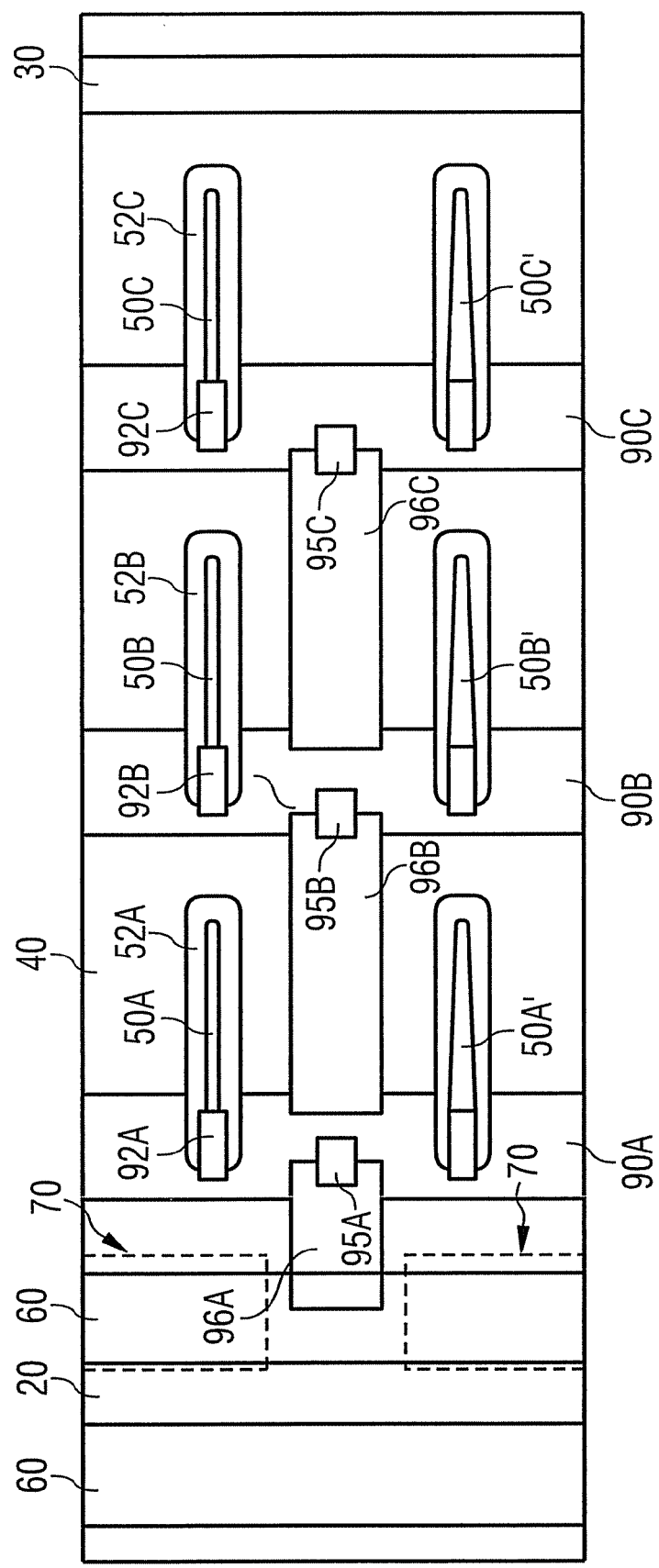
FIG 14b  E-E

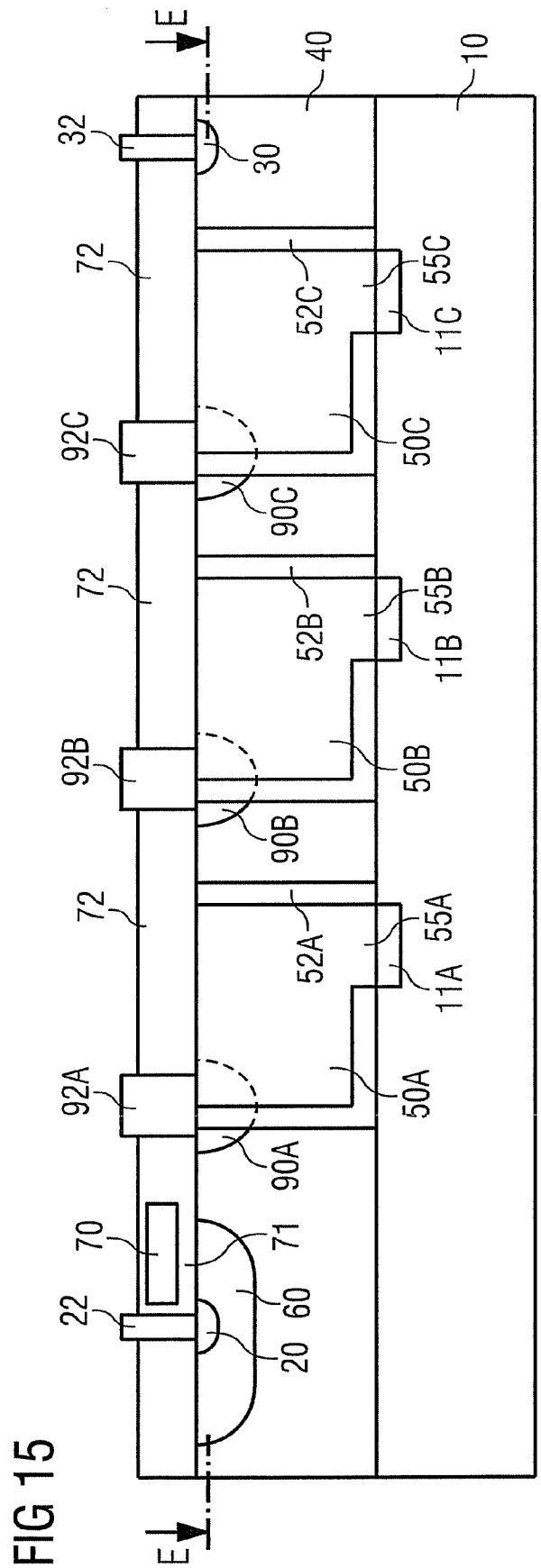

FIG 17
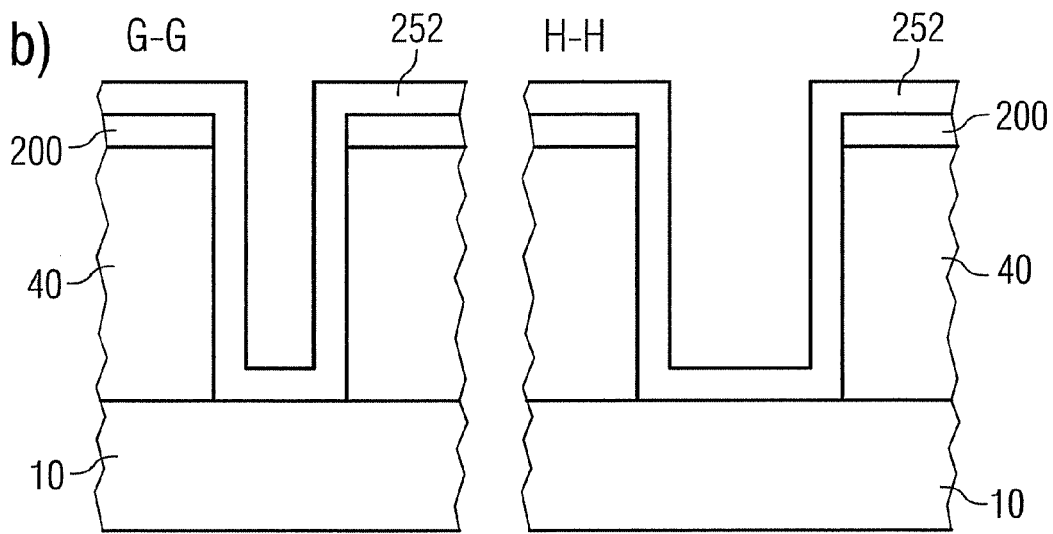
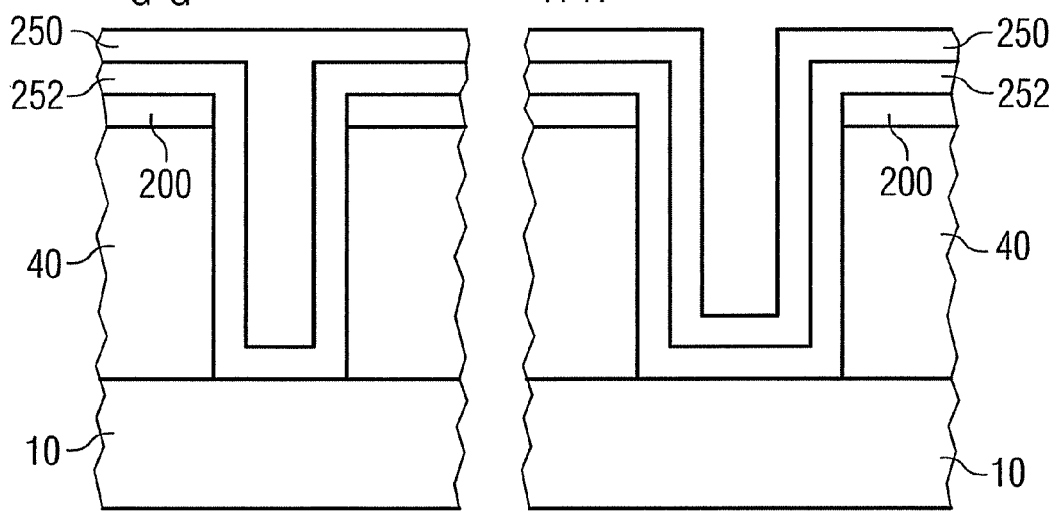
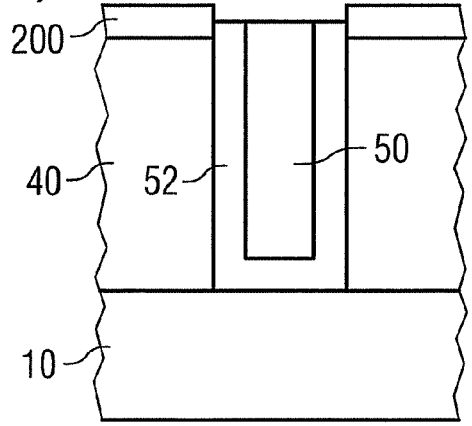
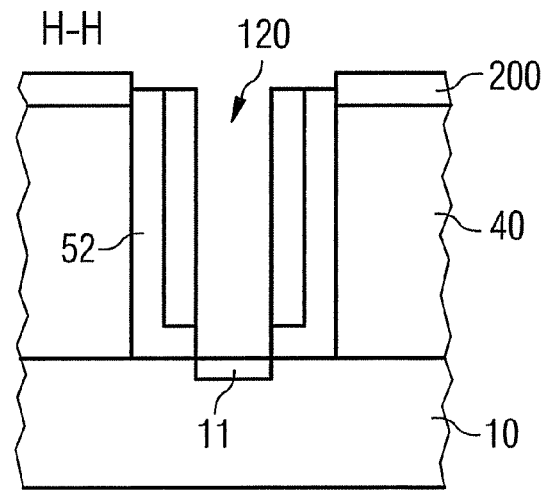

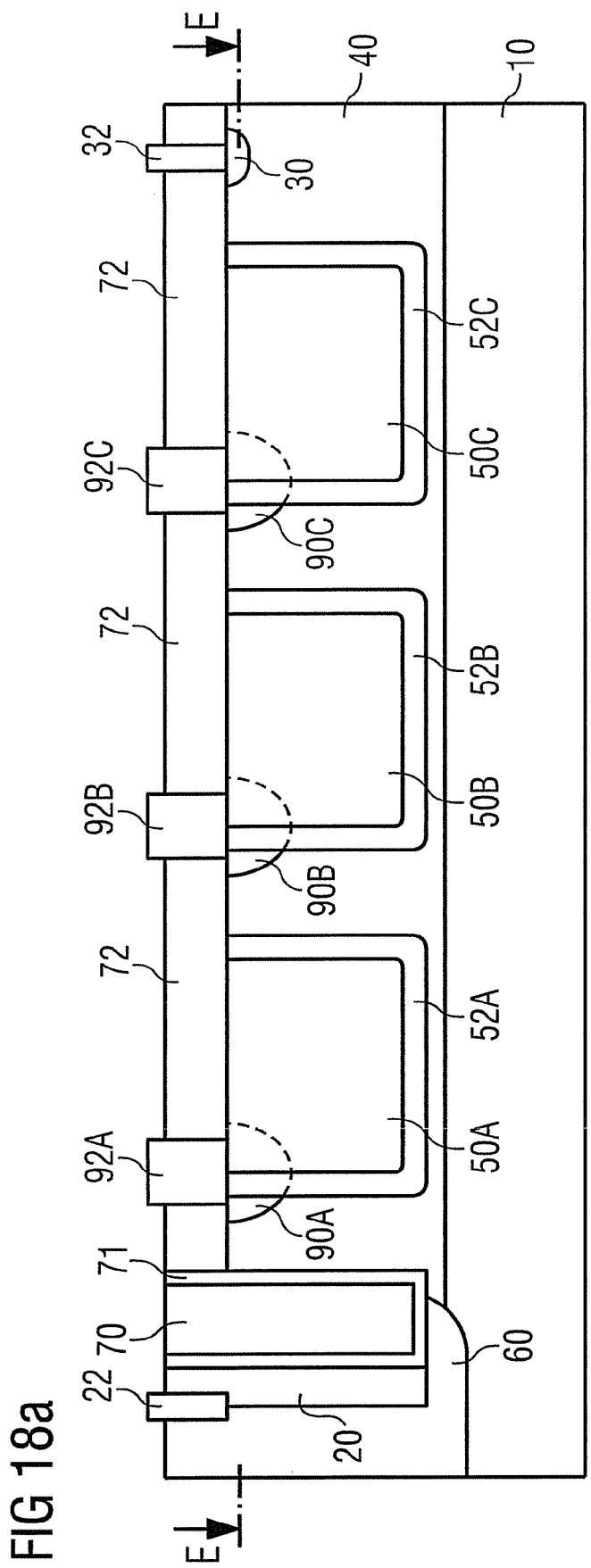

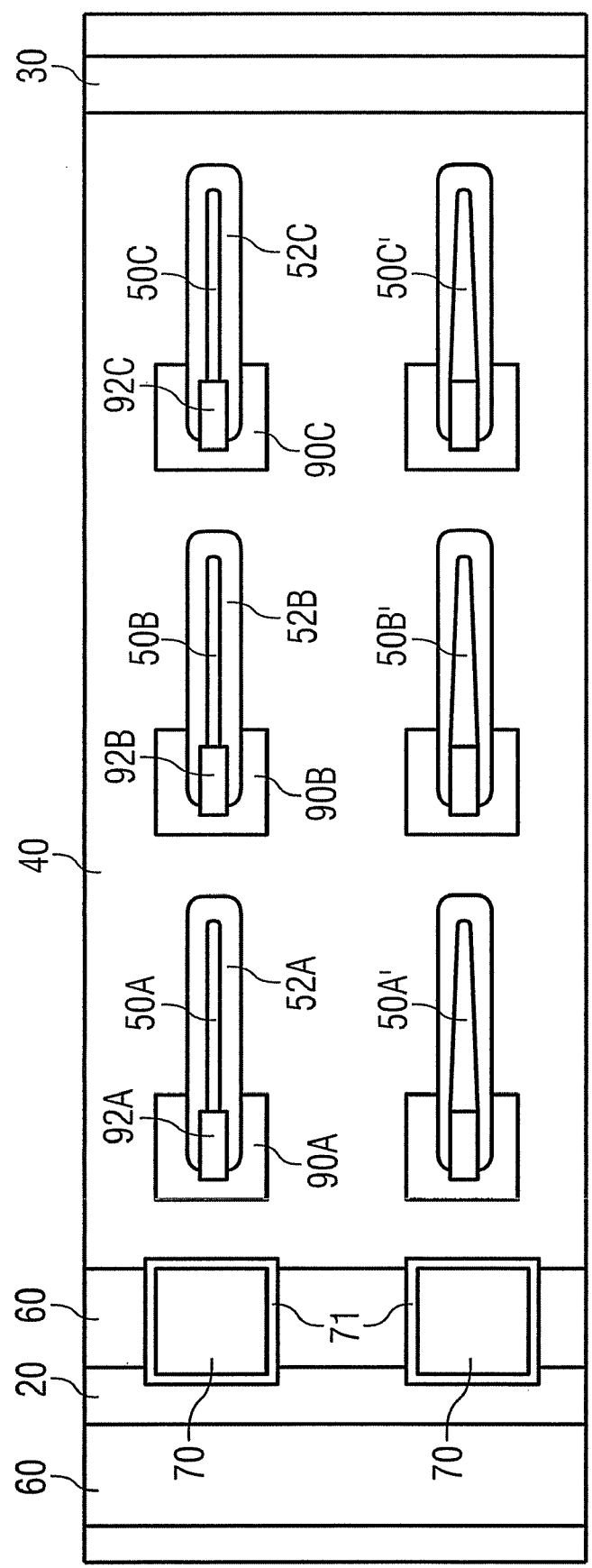

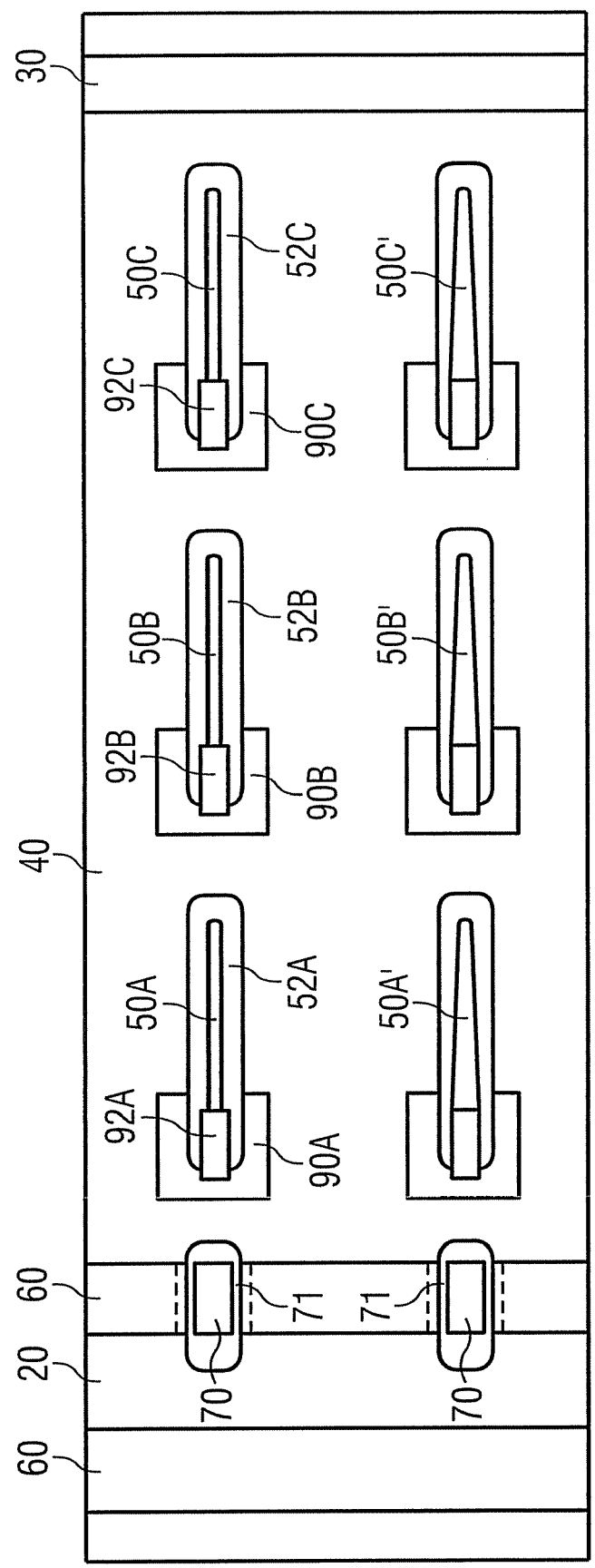

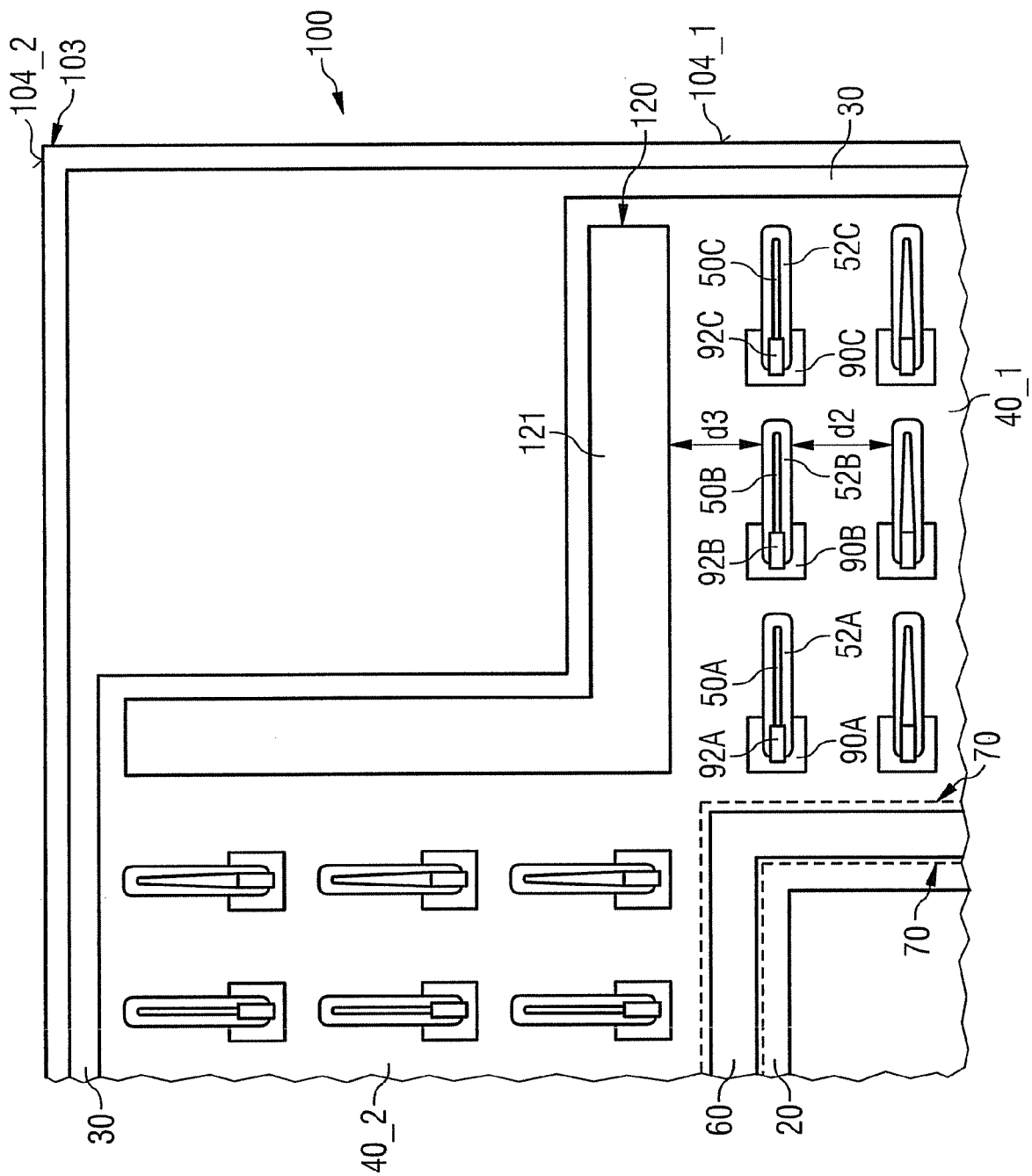

b)   J-J

LATERAL SEMICONDUCTOR COMPONENT WITH A DRIFT ZONE HAVING AT LEAST ONE FIELD ELECTRODE

CROSS-REFERENCE TO RELATED APPLICATIONS

This Utility Patent Application is a Divisional Application of U.S. patent application Ser. No. 10/926,581, filed Aug. 25, 2004, which claims priority to German Patent Application DE 103 39 488.5-33, filed Aug. 27, 2003, both of which are incorporated herein by reference.

FIELD OF THE INVENTION

The present invention relates to a lateral semiconductor component.

BACKGROUND

Lateral semiconductor components having a drift path running in the lateral direction of the semiconductor body and having a current path thus running in the lateral direction are generally known. Such components may be formed both as bipolar components, such as diodes or IGBTs, for example, or as unipolar components, such as MOSFETs or Schottky diodes, for example.

In the case of diodes, the two terminal zones are doped complementarily and the drift zone or base zone is doped by the same conduction type as one of the terminal zones, but more weakly. The two complementarily doped terminal zones form the anode and cathode zones of the diode.

In the case of a MOS transistor, a first terminal zone serving as source zone and of the same conduction type as the second terminal zone serving as drain zone is present, the source zone being separated from the drift zone by means of a body zone of the second conduction type. A gate electrode formed in a manner insulated from the semiconductor zones serves for forming a conducting channel in the body zone between the source zone and the drift zone. The source zone and the drain zone are of the same conduction type in the case of a MOSFET, while the source zone, or emitter zone, and the drain zone, or collector zone, are doped complementarily in the case of an IGBT.

What is crucial for the dielectric strength of such components, that is to say for the maximum voltage that can be applied between their terminal zones before a voltage breakdown occurs, is the configuration, here in particular the doping and dimensioning in the lateral direction, of the drift zone. The drift zone takes up the majority of the applied voltage in the case of such components in the blocking state, that is to say in the case of a diode when a voltage is applied which reverse-biases the pn junction between the anode and the drift zone, and in the case of a MOS transistor when a load path voltage is applied and the gate electrode is not driven. A reduction of the dopant concentration of the drift zone or a lengthening of the drift zone in the current flow direction increases the dielectric strength, but is detrimental to the on resistance.

In accordance with the compensation principle, in order to reduce the on resistivity of such lateral components, it is known from DE 199 58 151 A1 or DE 198 40 032 C1 to provide a compensation structure with complementarily doped zones arranged adjacent in the drift zone, which are mutually depleted of charge carriers in the off-state case. This results in the possibility of doping the drift zone more highly with the dielectric strength remaining the same, as a result of which the on resistance decreases.

These complementarily doped zones that in each case extend in elongated fashion in the lateral direction of the semiconductor body between the terminal zones may be fabricated for example by successive deposition of respectively complementarily doped epitaxial layers. Such a construction principle is cost-intensive, however, since a plurality of epitaxy steps and one to two masked dopant implantations per epitaxial layer are required.

In the case of vertical semiconductor components, for the purpose of reducing the on resistance, it is additionally known to provide at least one field electrode running in the vertical direction of the semiconductor body in a manner insulated from the drift zone, said field electrode being at a defined potential. In the off-state case, said field electrode likewise compensates for charge carriers in the drift zone, which results in the possibility of doping the drift zone of the component more highly compared with components without such a field electrode, with the dielectric strength remaining the same, which in turn leads to a reduction of the on resistance.

U.S. Pat. No. 4,941,026 describes such a vertical component with a field electrode that is at a fixed potential. Semiconductor components with a field electrode arranged in the drift zone are described, moreover, in U.S. Pat. No. 6,717,230 B2 or U.S. Pat. No. 6,555,873 B2.

SUMMARY

One embodiment provides a lateral semiconductor component having a drift zone which has a reduced on resistivity and can be fabricated simply and cost-effectively.

BRIEF DESCRIPTION OF THE DRAWINGS

The present invention is explained in more detail below on the basis of exemplary embodiments in figures.

FIG. 1 illustrates a first exemplary embodiment of a semiconductor component formed as a lateral field-effect transistor with a field plate arranged in a drift zone.

FIG. 2 illustrates an exemplary embodiment of a semiconductor component formed as a lateral diode with a field plate arranged in a drift zone.

FIG. 3 illustrates an exemplary embodiment of a lateral semiconductor component formed as a lateral Schottky diode with a field plate arranged in a drift zone.

FIG. 4 illustrates a second exemplary embodiment of a semiconductor component formed as a lateral field-effect transistor.

FIG. 8 illustrates a modification of the component illustrated in FIG. 7.

FIG. 9 illustrates a semiconductor component with a field electrode arrangement for setting the breakdown site in the lateral direction.

FIG. 11 illustrates a cross section through a semiconductor component with a field electrode arrangement for setting the breakdown site in the vertical direction.

FIG. 12 illustrates a cross section through a semiconductor component with a doping that is increased or reduced locally in the drift zone for the purpose of setting the breakdown site in the vertical direction.

FIG. 13 illustrates a lateral semiconductor component in accordance with FIG. 7 with a discharge structure in accordance with a first exemplary embodiment.

FIG. 14 illustrates a lateral semiconductor component in accordance with FIG. 7 with a discharge structure in accordance with a second exemplary embodiment.

FIG. 15 illustrates a lateral semiconductor component in accordance with FIG. 7 with a discharge structure in accordance with a third exemplary embodiment.

FIG. 18 illustrates a cross section through a semiconductor component in accordance with FIG. 7 with a drive electrode extending into the semiconductor body in the vertical direction.

FIG. 20 illustrates a detail from a corner region of a lateral semiconductor component according to the invention, with a corner structure in accordance with a first exemplary embodiment.

DETAILED DESCRIPTION

Figure 5:
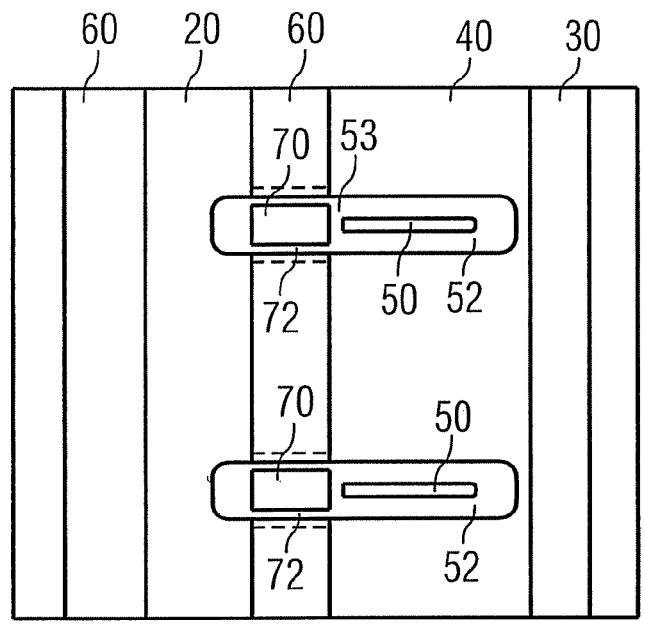
FIG. 5 illustrates a component that is modified relative to the component in FIG. 4.

In one embodiment, the semiconductor component according to the invention comprises a semiconductor body with a first side and a second side, and also a drift zone, which is arranged in the semiconductor body below the first side and extends in a first lateral direction of the semiconductor body between a first and a second doped terminal zone. In this embodiment, at least one field electrode is arranged in the drift zone, said field electrode extending into the drift zone proceeding from the first side and being arranged in a manner electrically insulated from the semiconductor body.

In this embodiment, the dimensions of the field electrode in the vertical direction of the semiconductor body preferably approximately correspond to the dimensions of the drift zone in the vertical direction of the semiconductor body.

In contrast to a compensation structure with a plurality of respectively complementarily doped semiconductor zones arranged adjacent to one another, such a field plate which extends into the drift zone proceeding from the first side can be produced simply and cost-effectively. Thus, in the simplest case for producing such a field plate, it is necessary merely to produce a trench in the drift zone proceeding from the first side, to produce an insulation layer on the trench sidewalls, and to fill the trench with an electrode material.

When the component is in the off state, said field plate which comprises an electrically conductive material, for example a metal or a highly doped semiconductor material, and is insulated from the drift zone partly compensates for the charge carriers present in the drift zone. This results in the possibility of doping the drift zone more highly—with the dielectric strength of the component remaining the same—than in the case of a lateral component without such a field electrode, and thus of reducing the on resistance. In order to achieve this compensation effect, the at least one field plate, depending on the embodiment, is put at one of the potentials of the terminal zones or at a potential derived from the potential conditions in the drift zone.

Preferably, at least two field electrodes arranged at a distance from one another are present in a second lateral direction essentially running perpendicular to the first lateral direction, thereby achieving an improved compensation effect in the section of the drift zone between in each case two adjacent field electrodes.

The at least one field electrode is preferably formed in plate-type fashion and extends in its longitudinal direction along the first lateral direction in the drift zone. In the vertical direction, this plate-type field electrode preferably extends into the semiconductor body approximately as far as the drift zone.

In one embodiment, the field electrode is electrically coupled to one of the two terminal zones, as a result of which the field plate is always at a defined potential pre-scribed by the respective terminal potential.

In order to increase the compensation effect, one embodiment of the invention provides for a plurality of field electrodes arranged at a distance from one another in the first lateral direction to be provided in the drift zone, said field electrodes preferably being at different potentials.

These different potentials are chosen such that, in the off-state case of the component, if there is a rise in the potential in the drift zone proceeding from one of the terminal zones in the lateral direction, the potential of the field electrodes rises from field electrode to field electrode in order to achieve, for all the field electrodes, an as far as possible identical voltage loading on the insulation layer surrounding them.

These different potentials may be generated for example by a zener diode chain with intermediate taps that is arranged between the first and second terminal zones. Such a zener diode chain and its realization is described for example in DE 199 54 600 C1, to which reference is made in this respect.

One embodiment of the invention provides for the at least one field plate to be coupled to a semiconductor zone doped complementarily with respect to the drift zone, said semiconductor zone being arranged in floating fashion in the drift zone, this semiconductor zone preferably being situated at the level of the field electrode in the first lateral direction.

In the component, a space charge zone forms in the drift zone when a reverse voltage is applied, and propagates in the lateral direction as the reverse voltage increases. In the off-state case, the at least one semiconductor zone arranged in floating fashion in the drift zone has the effect that the electrically conductive field electrode that is assigned to it and is insulated from the drift zone assumes a potential corresponding to the potential of the space charge zone at the position of the floating semiconductor zones. On the basis of the fact that the floating semiconductor zone is situated in the region of the position of the field electrode in the lateral direction, the dielectric strength of the insulation layer surrounding the field electrode only has to be as large as the voltage difference in the drift zone between the position of the floating semiconductor zone and the position in the region of that point of the field electrode which is the furthest away in the lateral direction. If said semiconductor zone arranged in floating fashion is situated just beside the field electrode in the first lateral direction, then the maximum voltage that occurs between the field electrode and the surrounding drift zone corresponds to the voltage drop along the field electrode in the drift zone.

In the embodiment in which a plurality of field electrodes arranged at a distance from one another in the first lateral direction are present, the field electrodes are in each case assigned a semiconductor zone arranged in floating fashion in the drift zone, said semiconductor zone being situated in the region of the position of the assigned field electrode.

The at least one field electrode is preferably connected via a terminal contact arranged above the first side to the semiconductor zone arranged in floating fashion in the drift zone, said semiconductor zone in this case adjoining the first side.

If the drift zone of the component has been doped for example by means of a diffusion method, then the charge carrier concentration usually decreases proceeding from the first side in the vertical direction of the drift zone. In order to optimize the field profile of the electric field in this case, the field electrode preferably tapers in the vertical direction of the semiconductor body proceeding from the first side, or the width of a trench in which the electrode is arranged decreases with increasing depth. In this case, the thickness of the insulation layer surrounding the field plate preferably remains the same at all points.

As explained above, the voltage loading on an insulation layer surrounding the field electrode varies in the off-state case owing to the potential that changes along the field plate in the drift zone. In order to avoid voltage breakdowns of this insulation layer, the thickness of the insulation layer preferably varies in the first lateral direction in such a way that said thickness likewise increases in the direction of the increasing voltage loading.

In an embodiment with at least two field electrodes arranged at a distance from one another in the second lateral direction of the component, additional measures are preferably taken in order to define the profile of the electric fields in the drift zone and in this case in particular the "breakdown location" from which a voltage breakdown proceeds in the event of the maximum reverse voltage of the component being reached. In the event of voltage breakdown, an avalanche effect occurs in which charge carriers, that is to say electrons and holes, generate further charge carriers on account of the high electric field strength in the drift zone. The properties of the component are dependent on the distance covered by the charge carriers in the event of avalanche breakdown up to the respective terminal zone of complementary polarity to the charge carriers, and are thus dependent on the position of the breakdown location in the drift zone. This location preferably lies in the center of the drift zone in the first lateral direction.

The position of the breakdown location can be set by means of a suitable geometry or positioning of the at least two field electrodes, from which a local field boosting results. One embodiment in this case provides for the two field electrodes to be formed in plate-type fashion, at least one of the electrodes being arranged obliquely relative to the first lateral direction, which defines the main current flow direction in the drift zone. On account of the oblique arrangement of at least one of the electrodes, the distance between the two field electrodes varies in the main current direction, the breakdown site being present in the drift zone in the region of the smallest distance at which the largest field boosting is present.

A further embodiment provides for at least one of the field electrodes to have a projection extending in the second lateral direction in order to reduce the distance from the adjacent field electrode locally in the region of said projection, and thereby to obtain a boosting of the electric field in said region.

The field profile in the lateral direction can also be set by way of the thickness of the insulation layer surrounding the field plate, or by way of the doping of the drift zone in the first lateral direction of the component.

In a corresponding manner, the breakdown site in the vertical direction of the component may be set by means of the geometry of two adjacent field plates or by means of the doping of the drift zone in the vertical direction, the breakdown site preferably lying at a distance from the first side of the component in the depth.

For this purpose, one embodiment provides for the field electrode to be widened with increasing depth, in order thereby to reduce the distance between two adjacent field electrodes in the depth of the component and thereby to define the breakdown site.

A further embodiment provides for varying the doping in the vertical direction of the component for the purpose of setting the breakdown site, and in this case for achieving a boosting of the electric field at a desired position in particular by means of a locally increased or reduced effective doping concentration. The local variation of the doping may be effected for example by means of an implantation of dopant atoms of the same conduction type or of the complementary conduction type with respect to the drift zone, and, if desired, an outdiffusion of the implanted charge carriers.

By means of a locally increased or reduced effective doping of the drift zone, it is possible to set not only the position of the breakdown site in the vertical direction but also, of course, the position of the breakdown site in the lateral direction.

In one embodiment, the component with the drift zone extending in the lateral direction of the semiconductor body is formed such that both the first and the second terminal zone can be contact-connected at the first side of the component. A further embodiment provides for the possibility of contact-connecting the first terminal zone at the first side of the semiconductor body and the second terminal zone at the second side of the semiconductor body, said second side being remote from the first side. In this case, the second terminal zone extends into the semiconductor body in the vertical direction of the component and adjoins a semiconductor zone of the same conduction type in the region of the second side of the semiconductor body, said semiconductor layer serving as a terminal for the second terminal zone.

The present invention can be applied to any desired lateral semiconductor components which have a drift zone for taking up a voltage in the off-state case.

Thus, one embodiment provides for the component to be formed as a diode. In this case, the first and second terminal zones between which the drift zone extends are doped complementarily with respect to one another.

A further embodiment provides for the component to be formed as a field-effect transistor, in particular as a MOSFET or an IGBT. In the case of such a component, a first terminal zone is present which is of the same conduction type as the drift zone, a complementarily doped channel zone being arranged between said first terminal zone and the drift zone. A drive electrode arranged in a manner insulated from the semiconductor body is present adjacent to said channel zone.

In one embodiment, this drive electrode is arranged above the first side of the semiconductor body and, in a further embodiment, extends into the semiconductor body in the vertical direction. The first terminal zone forms a MOSFET's source zone and an IGBT's emitter zone, while the second terminal zone forms a MOSFET's drain zone and an IGBT's collector zone. Said second terminal zone is of the same conduction type as the first terminal zone in the case of a MOSFET and doped complementarily with respect to the first terminal zone in the case of an IGBT.

In the figures, unless specified otherwise, identical reference symbols designate identical semiconductor regions and parts with the same meaning.

FIG. 1 illustrates a first exemplary embodiment of a lateral semiconductor component according to the invention, which is formed as a field-effect transistor, FIG. 1a illustrating the component in side view in cross section and FIG. 1b illustrating a cross section through the sectional plane A-A depicted in FIG. 1a. The component comprises a semiconductor body 100 with a first side 101, which forms the front side in the example illustrated, and a second side 102, which forms the rear side in the example illustrated. In the region of the front side 101, first and second doped terminal zones 20, 30 are introduced into the semiconductor body 100, and form a MOSFET's source zone and drain zone and an IGBT's emitter zone and collector zone. In a first lateral direction of the semiconductor component body 100, which runs between the first and second terminal zones 20, 30, a drift zone 40 extends between said terminal zones, a channel zone or body zone 60 doped complementarily with respect to the first zone 20 and the drift zone 40 being arranged between the first zone 20 and the drift zone 40. A drive electrode 70 is present in a manner insulated from the semiconductor body 100 and adjacent to the body zone 60, which drive electrode forms the gate electrode of the component and is arranged above the front side 101 of the component in the exemplary embodiment illustrated.

In the example, the semiconductor region forming the drift zone 40 of the component is arranged above a semiconductor substrate 10, which is preferably doped complementarily with respect to the drift zone 40 and forms the rear side 102 of the semiconductor body 100. It should be pointed out that the dimensions in FIG. 1a are not true to scale. The semiconductor substrate 10 is usually substantially thicker than the drift zone 40, the semiconductor region forming the drift zone 40 being fabricated by means of an epitaxy method on the semiconductor substrate 10.

The component furthermore comprises a plurality of field plates 50, 50', which are arranged in the drift zone 40, are formed in plate-type fashion, extend into the drift zone 40 proceeding from the front side 101 and are insulated from the drift zone 40 and the semiconductor body 100 by means of insulation layers 52.

As can be gathered from the illustration in FIG. 1b, in particular, the first terminal zone 20, the body zone 60, the gate electrode 70 and the second terminal zone 30 extend in elongate fashion in a second lateral direction running perpendicular to the first lateral direction. In the first lateral direction, in the case of the exemplary embodiment in accordance with FIG. 1, in each case only one field plate is arranged between the terminal zones in the drift zone, while in the second lateral direction a plurality of such field plates are present at a distance from one another.

The at least one field plate 50 is preferably connected to the first or second terminal zone 20, 30 or to the gate electrode 70 in a manner that is not specifically illustrated.

With the component in the off state, that is to say when no drive potential is pre-sent at the gate electrode 70 and a space charge zone forms proceeding from the pn junction between the body zone 60 and the drift zone 40, the field plate 50, which is at a defined potential, effects a partial compensation of the charge carriers present in the drift zone 40. On account of this partial compensation of the charge carriers in the drift zone 40, the component in accordance with FIG. 1 affords the possibility of doping the drift zone more highly than in the case of conventional lateral components, without this resulting in a reduction of the dielectric strength of the component.

The principle explained functions both in the case of field-effect transistors that are formed as MOSFETs and in the case of field-effect transistors that are formed as IGBTs. In the case of a MOSFET, the source zone 20 and the drain zone 30 are of the same conduction type as the drift zone 40, the drift zone 40 being doped more weakly than the source zone 20 and the drain zone 30. Said zones 20, 30 and the drift zone 40 are n-doped in the case of an n-conducting MOSFET. In the case of a component formed as an IGBT, the first terminal zone 20 serves as emitter zone, which is usually n-doped, while the second terminal zone 30, which is doped complementarily with respect to the emitter zone 20, forms the collector zone of the component. The drift zone 40 is doped by the same conduction type as the emitter zone 20, but more weakly.

With the component in the off state, there is a voltage drop present in the drift zone 40 between the channel zone 60 and the second terminal zone 30. Assuming that the field plate 50 is at the same potential as the first zone 20, the voltage loading on an insulation layer 52 surrounding the field plate 50 increases as the distance from the body zone 60 increases. In order to avoid a voltage breakdown, the field plate and the insulation layer surrounding it are preferably coordinated with one another such that the thickness of the insulation layer increases in the direction of the second terminal zone 30, as is illustrated for the field plate 50' in FIG. 1b. Said field plate 50' runs in wedge-shaped fashion in the first lateral direction of the component. This wedge-shaped field plate 50' is arranged in a trench which is essentially rectangular in plan view and whose side walls are covered with the insulation layer 52'. On account of the wedge-shaped geometry of the field plate 50' and the rectangular geometry of the trench, the insulation layer 52' between the field plate 50' and the drift zone 40 surrounding the trench of the field plate consequently has a thickness that increases in the direction of the second terminal zone 30.

As is illustrated in FIG. 1c, which shows a section in the sectional plane F-F depicted in FIG. 1b, the plate-type field plate 50 is preferably formed such that it tapers in the vertical direction of the semiconductor body proceeding from the front side 101. The same may correspondingly hold true for the trench in which the field plate 50 is arranged, which results in a thickness of the insulation layer 52 which, considered in the vertical direction, is approximately of the same thickness at all points.

FIG. 2 illustrates a lateral semiconductor component formed as a diode, which differs from the component formed as a field-effect transistor and illustrated in FIG. 1 essentially by the fact that there is no gate electrode present and that a first terminal zone 21 is doped complementarily with respect to the second terminal zone 30. The first terminal zone 21 is contact-connected by a first terminal electrode 22 in a manner corresponding to the first terminal zone 20 in accordance with the component in FIG. 1, while the second terminal zone 30 is contact-connected by a second terminal electrode 32 in a manner corresponding to the second terminal zone 30 in FIG. 1. An insulation layer or passivation layer 72 is applied above the front side 101 of the component in a manner corresponding to the component in FIG. 1.

In the exemplary embodiment, the first terminal zone 21 is p-doped and forms the anode zone of the diode, while the second terminal zone 30, like the drift zone 40, too, is n-doped and forms the cathode zone of the component.

When a reverse voltage is applied, that is to say when a positive voltage is applied between the cathode zone 30 and the anode zone 21, a space charge zone forms proceeding from the pn junction between the anode zone 21 and the drift zone 40. In this operating state, the field plate 50, which is preferably at the potential of the anode zone 21, compensates for a portion of the charges present in the drift zone.

FIG. 3 illustrates a further exemplary embodiment of a lateral semiconductor component according to the invention, which is formed as a Schottky diode and differs from the diode illustrated in FIG. 2 essentially by the fact that the p-doped anode zone 21 illustrated in FIG. 2 is replaced by a zone formed from a Schottky metal 80, said Schottky metal 80 being introduced into a trench in the region of the front side 101 of the semiconductor body 100.

Further exemplary embodiments of lateral semiconductor components according to the invention are explained below in FIGS. 4 to 8 on the basis of lateral MOSFETs. It should be pointed out that the exemplary embodiments below also, of course, apply in a corresponding manner to IGBTs, diodes or Schottky diodes.

FIG. 4 illustrates an exemplary embodiment of a lateral semiconductor component formed as a field-effect transistor. This component in accordance with FIG. 4 differs from that illustrated in FIG. 1 essentially by the fact that the gate electrode 70 is arranged in a trench extending into the semiconductor body 100 in the vertical direction proceeding from the front side 101. The gate electrode 70 extends, in a manner surrounded by a gate insulation layer 71, in the vertical direction over approximately the entire depth of the drift zone 40 as far as the semiconductor substrate 10 doped complementarily with respect to the drift zone 40. In this exemplary embodiment, the body zone 60 extends right into said semiconductor substrate 10 proceeding from the front side 101, while the source zone 20 is completely surrounded by the body zone 60 in the semiconductor body. In the first lateral direction, the gate electrode 70 extends, in a manner surrounded by the gate insulation layer 71, from the source zone 20 through a section of the body zone 60 right into the drift zone 40. When a suitable drive potential is applied, a conducting channel forms along the gate electrode 70 in the body zone 60, which is illustrated by broken lines in FIG. 4b.

In the exemplary embodiment in accordance with FIG. 4, the gate electrode 70 and the field plate 50 are arranged in a common trench, the field plate 50 directly adjoining the gate electrode 70 and thus being at the same potential as the gate electrode 70. The insulation layer 52 surrounding the field plate 50 is thicker than the gate insulation layer 71. Of course, in this exemplary embodiment as well, the field plate 50 may be formed in wedge-shaped fashion in the first lateral direction in a manner corresponding to the field plate 50' illustrated in FIG. 1b.

FIG. 5 illustrates a plan view of a modification of the component in accordance with FIG. 4, the component in accordance with FIG. 5 differing from that illustrated in FIG. 4 by the fact that the gate electrode 70 and the field plate 50 are isolated from one another by an insulation layer 53. In this exemplary embodiment, the field plate 50 is put at the potential of the source zone 20, for example.

In the case of the exemplary embodiments in accordance with FIGS. 1 to 5, the first and second terminal zones 20, 30 can in each case be contact-connected via terminal electrodes 22, 32 at the front side 101 of the semiconductor body 100. The component in accordance with FIG. 6 differs from this, the construction of this component essentially corresponding to that of the component in accordance with FIG. 4. In the case of this component, the second terminal zone 30 extends in the vertical direction of the semiconductor body 100 through the drift zone 40 and the underlying semiconductor layer 10 doped complementarily with respect to the drift zone 40 as far as a semiconductor layer 31 in the region of the rear side 102 of the semiconductor body 100, said semiconductor layer 31 being of the same conduction type as the second terminal zone 30 and enabling contact to be made with the second terminal zone 30 via the rear side 102 of the semiconductor body 100. The reference symbol 32 in FIG. 6 designates a terminal electrode applied to the rear side 102. In the case of an n-conducting component, the semiconductor layer 31 is for example a heavily n-doped semiconductor substrate to which a more weakly p-doped semiconductor layer 10 and the more weakly n-doped drift zone 40 are applied in the epitaxy method. It is furthermore possible to fabricate the heavily n-doped semiconductor layer 31 proceeding from a weakly p-doped semiconductor substrate 10 by implanting n-type dopant atoms into the semiconductor substrate 10 proceeding from the rear side 102 of the semiconductor body, in order to produce the heavily n-doped semiconductor zone 31.

Figure 7A:
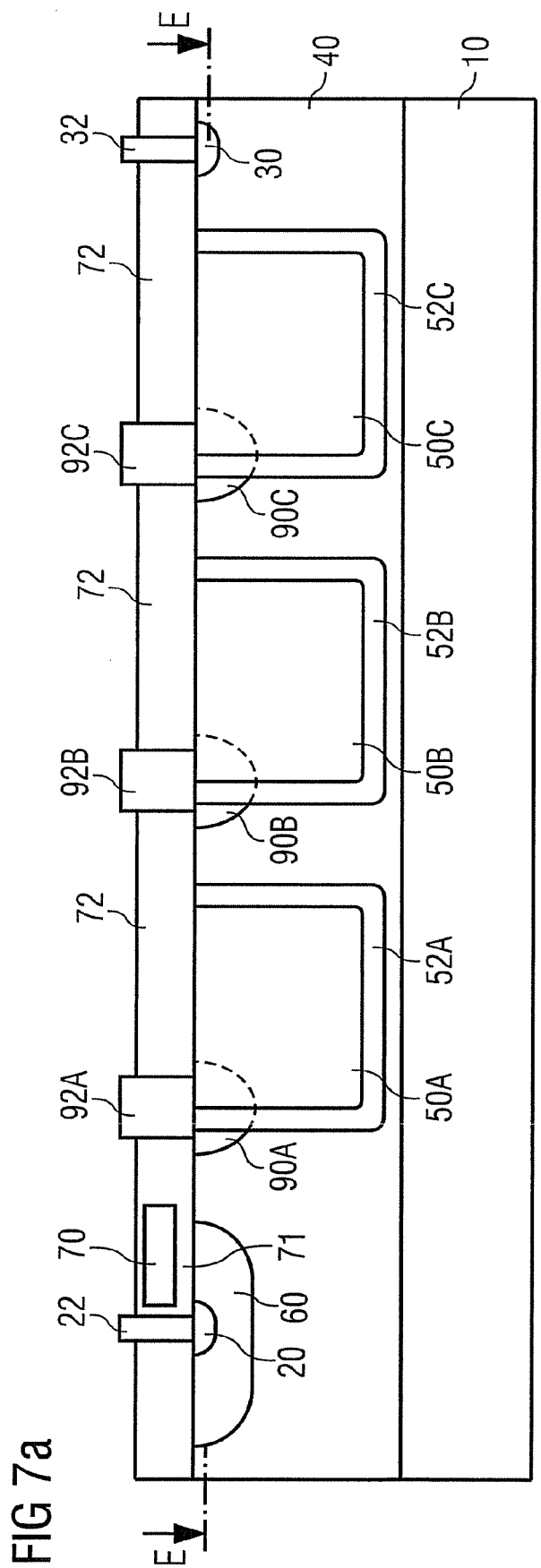
FIG. 7 illustrates a lateral semiconductor component according to the invention with a plurality of field electrodes arranged at a distance from one another in a drift zone, said field electrodes being at different potentials in the off-state case of the component.

FIGS. 7a and 7b illustrate a further exemplary embodiment of a lateral field-effect transistor, FIG. 7a showing the component in side view in cross section and FIG. 7b showing a cross section along the sectional planes E-E depicted in FIG. 7a.

This component comprises a plurality of field plates 50A, 50B, 50C —three in the example illustrated—which are arranged at a distance from one another in the first lateral direction in the drift zone 40 between the first and second terminal zones 20, 30, in the present case between the source zone and the drain zone. The field plates 50A-50C are in each case formed in plate-type fashion and extend into the semiconductor body in the vertical direction, in each case surrounded by an insulation layer 52A-52C, proceeding from the front side 101.

For a distance d2 between two adjacent trenches in a direction transversely with respect to the current flow direction in comparison with a distance d4 between two trenches arranged successively in the current flow direction, it preferably holds true that $d4 \leq 0.5 \cdot d2$.

Semiconductor zones 90A, 90B, 90C which are arranged in each case in floating fashion in the drift zone 40 and are doped complementarily with respect to the drift zone 40 are present adjacent to the field plates 50A-50C and are electrically conductively connected to the field plate 50A, 50B, 50C that is respectively arranged adjacent. In the exemplary embodiment illustrated, these semiconductor zones 90A, 90B, 90C arranged in floating fashion are situated in the region of the front side 101 of the semiconductor body 100 and are connected by means of terminal contacts 92A, 92B, 92C, arranged above the front side 101 of the semiconductor body, to the respective field electrode or field plate 50A, 50B, 50C. The complementarily doped semiconductor zones 90A-90C may also be replaced by semiconductor zones of the same conduction type as the drift zone 40, these semiconductor zones being doped more highly than the drift zone and high enough that they are not completely depleted in the off-state case.

The functioning of these field electrodes 50A-50C and of the assigned semiconductor zones 92A-92C is explained below.

In the off-state case of the component, in the case of an n-conducting MOSFET, that is to say when a positive voltage is applied between the drain terminal 32 and the source terminal 22 and when the gate electrode 70 is not driven in conducting fashion, a space charge zone propagates in the drift zone 40 proceeding from the body zone 60 and propagates in the direction of the drain zone 30 as the reverse voltage increases. If the space charge zone makes contact with one of the arranged semiconductor zones 90A-90C, then the field electrode 50A-50C coupled to the respective semiconductor zone assumes the potential of the space charge zone at the position of the assigned semiconductor zone 90A-90C.

In order that, in the off-state case, the field electrodes 50A-50C are kept approximately at the potential of the space charge zone at the level of the field plates 50A-50C, the semiconductor zones 90A-90C arranged in floating fashion are arranged in the first lateral direction at the level of the field plates 50A-50C assigned to them. At the level of the assigned floating semiconductor zone 90A-90C, the voltage loading on the insulation layers 52A-52C surrounding the field electrodes 50A-50C is thus zero, the voltage loading increasing with increasing lateral distance from the floating semiconductor zone 90A-90C. In the exemplary embodiment illustrated, in which the floating semiconductor zones 90A-90C are arranged in the lateral direction in each case at an end of the field plates 50A, 50B, 50C, the maximum voltage loading on the insulation layer 52 corresponds to the voltage drop along the assigned field electrode 50A-50C in the drift zone 40. In order to combat the voltage loading increasing in the lateral direction in this case, the thickness of the insulation layer 52 preferably increases with increasing distance from the floating semiconductor zone, as is illustrated for field plates 50A', 50B', 50C' in FIG. 7b.

The advantage of the floating semiconductor zones 90A-90C is that the field plates 50A, 50B, 50C are in each case kept at a potential which is adapted to the potential conditions in the drift zone 40, which results in a low voltage loading on the insulation layer 52A-52C respectively surrounding the field plates 50A-50B. By virtue of the plurality of field plates 50A-50C arranged at a distance from one another in the first lateral direction in the drift zone 40, an improved compensation effect is achieved compared with the provision of only one such field plate. The compensation principle explained on the basis of the MOSFET illustrated in FIGS. 7a and 7b can, of course, also be applied to IGBTs, an IGBT being obtained from the component illustrated in FIGS. 7a and 7b by doping the second terminal zone 30 complementarily with respect to the drift zone 40. If said second terminal zone is n-doped in the case of an n-channel MOSFET, in which it forms the drain zone thereof, it is p-doped in the case of an IGBT. A diode can be obtained from the component illustrated in FIGS. 7a, 7b by dispensing with the body zone 60 and the gate electrode 70, the first terminal zone 20 having to be doped complementarily with respect to the n-doped drift zone 40 in this case. The first terminal zone in this case forms the anode zone or the p-type emitter of the diode, while the second terminal zone 30 forms the cathode zone or the n-type emitter of the component.

FIG. 8 illustrates a further realization possibility for the application of different potentials that increase in the direction of the drain zone 30 to the field plates 52A-52C. This exemplary embodiment provides for connecting a zener diode chain with zener diodes Z1, Z2, Z3 between the drain zone 30 and the source zone 20, intermediate taps being provided which are in each case applied to the field plates 50A-50C. A possible realization of such a zener diode chain, which is only illustrated diagrammatically in FIG. 8, in a lateral semiconductor component is described in DE 199 54 600 C1, to which reference is hereby made. In this case, the field plate 50A nearest to the source terminal 20 may be put at source potential, as is illustrated in FIG. 8. Zener diodes Z1-Z3 are respectively connected between the terminals of the field plates 50A-50C and between the terminal of the field plate 50C nearest to the drain zone 30 and the drain terminal 30, so that the potential difference between two adjacent field plates corresponds at most to the breakdown voltage of one of the zener diodes.

If the maximum reverse voltage is reached when a reverse voltage is applied to the component, then an avalanche breakdown occurs in the case of which charge carriers generated first in the drift zone 40 generate further charge carriers on account of the high field strength prevailing in the drift zone 40. Ideally, the site at which such a voltage breakdown first occurs is precisely defined by suitable measures.

FIG. 9 illustrates an exemplary embodiment of a semiconductor component according to the invention with a plurality of field plates 50A, 50B", 50C arranged at a distance from one another in the first lateral direction between the source zone 20 and the drain zone 30. In the second lateral direction essentially running perpendicular to the first lateral direction, a plurality of such arrangements are arranged at a distance from one another, thereby forming a plurality of drift zone sections lying between in each case two field plates 50A, 50B", 50C arranged at a distance from one another in the second lateral direction. In the first lateral direction, three field plates in each case are arranged at a distance from one another here in the exemplary embodiment.

In order to achieve a voltage breakdown as far as possible in the center of the first lateral direction in the drift zone 40, the exemplary embodiment in accordance with FIG. 9 provides for the field plates 50B" that are arranged at a distance from one another in the second lateral direction in the central region of the drift zone 40 in each case to be arranged obliquely with respect to the field plate 50B" that is adjacent in the second lateral direction. The field electrodes 50B" formed in plate-type fashion here in each case form an angle of less than 90° with a straight line running in the first lateral direction between the source zone 20 and the drain zone 30, those ends of adjacent field plates 50B" which face the source zone 20 or the drain zone 30 in each case being rotated with respect to one another. This results in the formation of sections 41, 42, 43 in the drift zone 40 in which there is a minimal distance between two adjacent field plates 50B". At these positions 41, 42, 43 in which adjacent field plates 50B" have a minimal distance, field boosting occurs when a reverse voltage is applied and finally the voltage breakdown occurs in the event of increasing elevation of the reverse voltage. The charge carriers generated at these positions 41, 42, 43 in the event of the voltage breakdown move in opposite directions to the terminal zones 20, 30 which are in each case of opposite polarity to the charge carriers. A voltage breakdown approximately in the center of the first lateral direction of the drift zone 40 is particularly advantageous because the complementary charge carriers, that is to say electrons and holes, in this case have to cover approximately identical distances to the terminal zones 20, 30 proceeding from the site of the voltage breakdown.

In a further embodiment, it is provided that in the second lateral direction, only every second field electrode 50B' is arranged obliquely relative to adjacent field plates, as is illustrated by broken lines in FIG. 9.

What is essential for defining the site of the voltage breakdown by means of the geometry of the field electrodes is that a distance between two field electrodes arranged at a distance from one another in the second lateral direction is reduced locally.

Figure 10:
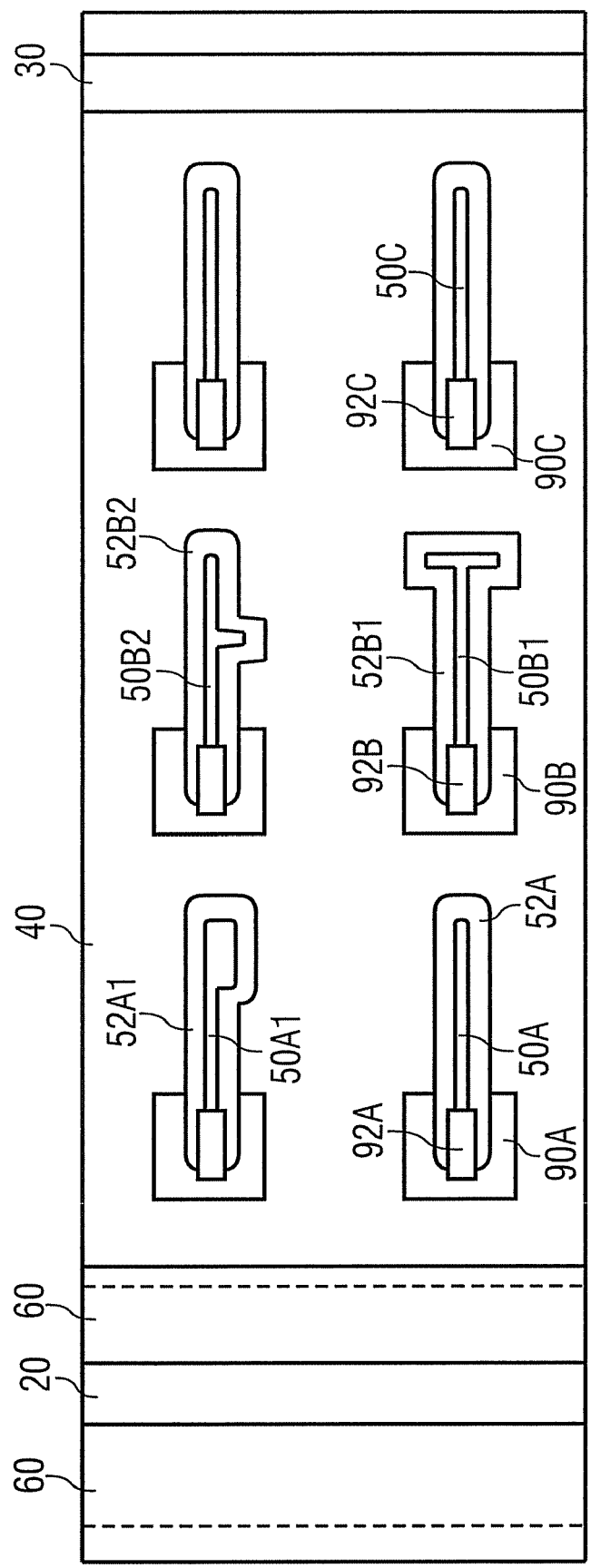
FIG. 10 illustrates a further semiconductor component with a field electrode arrangement for setting the breakdown site in the lateral direction.

FIG. 10 illustrates, on the basis of a component previously explained in FIG. 7, further possibilities for locally reducing the distance between two field electrodes arranged at a distance from one another in the second lateral direction.

Referring to the field electrode designated by the reference symbol 50B1, it is possible to form the field electrodes in T-shaped fashion in plan view, as a result of which the field plate 50B1 has two projections running in the second lateral direction. The distance to the field electrodes 50B2 spaced apart in the second lateral direction is reduced in the region of said projections. Such a projection or two such projections may be arranged as in the case of the field plate 50B1 at a front end of the field plate in the first lateral direction. However, it is also possible to arrange such a projection running in the second lateral direction at any other position of the field plate, as is illustrated in FIG. 10 on the basis of the field plate 50B2.

As in the case of the field plates 50B1, 50B2, the dimensions of said projection in the first lateral direction may be short in comparison with the dimensions of the field plate 50B1, 50B2 in the first lateral direction. However, the projection may also extend over a considerable length of the field plate, as is illustrated in FIG. 10 on the basis of the field plate 50A1.

Besides the setting of the field profile in the first lateral direction, and in this case in particular the setting of the breakdown site, using suitable geometries of the field electrodes, it is also possible, of course, to define the breakdown site in the vertical direction of the component by means of the geometry of two field electrodes arranged at a distance from one another in the second lateral direction.

This is illustrated in FIG. 11 on the basis of a modification of the component illustrated in FIG. 1. Whereas, referring to FIG. 1c, the field electrode in the case of one embodiment tapers proceeding from the first side 101 in order thereby to take account of a doping of the drift zone 40 that decreases downwardly, if appropriate, in the case of the example in accordance with FIG. 11 for the purpose of setting a breakdown site at a distance from the first side 101, provision is made for using field electrodes 50 which widen downwardly proceeding from the first side 101.

Besides the geometry of adjacent field electrodes, it is also possible to set the position of the breakdown site by means of the doping of the drift zone 40.

Thus, it is possible, for example, to locally increase or reduce the effective doping of the drift zone 40 at the desired breakdown position, preferably between two adjacent field electrodes 50. Depending on the distance between the two field electrodes, either a local increase or a local reduction of the effective doping of the drift zone may lead to a boosting of the field strength. In FIG. 12, such a site of an effective increase or reduction of the doping of the drift zone 40 is designated by the reference symbol 44. This region of increased or reduced doping is at a distance from the first side 101. The increase or reduction of the effective doping of the drift zone may be affected by introducing charge carriers of the same conduction type or of the complementary conduction type with respect to the drift zone 40. The introduction is effected for example by means of an implantation method followed, if appropriate, by a diffusion step.

As explained, the principle according to the invention may be applied to any lateral semiconductor components having a drift path. What is essential to this principle is the presence of a field electrode extending into the drift zone 40 proceeding from one side of the semiconductor body 100, said field electrode being arranged in a manner insulated from the semiconductor body. The insulation between the at least one field plate and the semiconductor body may be realized by means of any desired conventional insulation materials. Such insulation materials may be semiconductor oxides or dielectrics having a low dielectric constant. Furthermore, it is also possible to provide a cavity between the field plate and the surrounding drift zone as the insulation layer.

The field-effect transistors described with reference to the previous Figures are in each case formed as field-effect transistors that effect blocking in the reverse direction, i.e. there is no short-circuit present between the source zone 20 and the surrounding body zone 60. Of course, it is also possible to short-circuit the source zone 20 and the body zone 60 in order to obtain a field-effect transistor with a backward diode or freewheeling diode.

In the case of the semiconductor component illustrated in FIG. 7, in which the field electrodes 50A-50C are connected to semiconductor zones 90A-90C which are arranged in floating fashion in the drift zone 40 and are preferably doped complementarily with respect to the drift zone 40, there is the risk that during a switching operation during which the component undergoes transition from the blocking state to the conducting state, p-type charge carriers, i.e., holes, will not be able to flow into said floating semiconductor zones 90A-90C rapidly enough, the field plates 50A-50C thereby being pulled capacitively to a negative potential during switch-on. This negative potential brings about a depletion of charges in the drift zone and can significantly reduce the current flow when the semiconductor component is switched on again, i.e., after a transition from the blocking state to the conducting state, until the potential of the field plates 50A-50C is increased once again by leakage currents.

In order to avoid this problem, the component illustrated in FIGS. 13a and 13b is provided with a discharge structure for the semiconductor zones 90A-90C arranged in floating fashion. In the exemplary embodiment, this discharge structure comprises a semiconductor zone 94 arranged below the front side 101 of the semiconductor body 100, said semiconductor zone being doped by the same conduction type as the floating semiconductor zones 90A-90C and thus complementarily with respect to the drift zone 40 and connecting together the semiconductor zones 90A-90C arranged in floating fashion below the front side 101. Said semiconductor zone 94 is weakly doped in comparison with the semiconductor zones 90A-90C and has a doping that is below the breakdown charge of the semiconductor material used. In the case of silicon, said breakdown charge is approximately $2 \cdot 10^{12}$ cm$^{-2}$.

With the component in the off state, said weakly doped semiconductor zone is fully depleted of charge carriers, as a result of which the semiconductor zones 90A-90C are floating when the component is in the off state and can thus keep the field plates 50A-50C at different potentials along the drift path 40.

With the component in the on state, the weakly doped semiconductor zone 94 connects the otherwise floating semiconductor zones (high-impedance) to the potential of the first semiconductor zone 20. For this purpose, the weakly doped semiconductor zone 94 reaches right into the body zone 60 in sections in the example, which can be seen in particular from the plan view in FIG. 13b, the first terminal zone 20, which forms the source zone of the MOSFET, and the body zone 60 being short-circuited to one another by the source electrode 22 in the example.

It goes without saying that the discharge structure illustrated in FIG. 13 can also be applied to diodes, the weakly doped semiconductor zone 94 that is doped complementarily with respect to the drift zone 40 in this case reaching as far as the first terminal zone doped complementarily with respect to the drift zone in the case of a diode. Reference is made to FIG. 2 with regard to the fundamental construction of a diode using the field plate concept according to the invention. Furthermore, the discharge structure may also advantageously be applied to JFETs, Schottky diodes, IGBTs or other semiconductor components having a field plate structure explained.

The individual field plates 50A-50C may each be arranged in separate trenches, as is illustrated for the field plates 50A-50C in the upper part of FIG. 13b. Moreover, it is also possible to provide a continuous trench in the first lateral direction, in which trench the individual field plates are arranged at a distance from one another and in a manner in each case surrounded by an insulation layer 52 in the semiconductor body, this being shown in the lower part of FIG. 13b by way of example for the field plates 50A'-50C'.

A further exemplary embodiment of a discharge structure that supports the flowing-away of p-type charge carriers from the semiconductor zones 90A-90C arranged in floating fashion is illustrated in FIGS. 14a and 14b.

This discharge structure comprises electrodes 96A-96C which are arranged in the insulation layer 72 above the front side 101 of the semiconductor body and are insulated from the sections of the drift zone 40 that are arranged below the front side 101. The dimensions of these electrodes in the lateral direction are chosen such that an electrode 96A-96C in each case overlaps two floating semiconductor zones 90A-90C that are adjacent in the lateral direction, one of the control electrodes 96A overlapping the body zone 60 and the semiconductor zone 90A arranged adjacent to the body zone 60. In this case, the control electrode 96A-96C is electrically conductively connected via electrically conductive contacts 95A-95C to one of the semiconductor zones 90A-90C which it respectively overlaps. In the example, the electrode 96A-96C is connected to the semiconductor zone 90A-90C which respectively lies nearer to the second terminal zone 30. The electrode 96A-96C forms a p-conducting MOSFET with the two p-doped semiconductor zones which it respectively overlaps in the lateral direction—that is to say with two floating semiconductor zones or with one floating semiconductor zone and the body zone/channel zone—and the intervening section of the n-doped drift zone 40. In this case, the electrode 96A-96C forms the gate electrode of the MOSFET. The p-doped zone to which the control electrode 96A-96C is connected forms the drain zone of the MOSFET.

The functioning of this discharge structure is explained by way of example on the basis of the discharge structure formed by the floating semiconductor zones 90B, 90C and the control electrode 96C. If the potential at the semiconductor zone 90C lying nearer to the second terminal zone 30 falls below the potential of the semiconductor zone 90B by a value corresponding to the threshold voltage of the p-conducting MOSFET, then a conducting channel forms in the n-doped section of the drift zone 40 lying between the semiconductor zones 90B, 90C, which channel enables a current flow until the potential difference has fallen below the value of the threshold voltage of the transistor. What is thereby achieved overall is that the potential of the semiconductor zone 90C arranged furthest away from the body zone 60 can fall below the potential of the body zone 60 at most by a value corresponding to the product of the number of floating semiconductor zones 90A-90C and the threshold voltage of the p-conducting MOSFET. In the example in accordance with FIG. 14, the potential of the semiconductor zone 90C may at most fall to a potential which lies below the potential of the body zone 60 by the value of treble the threshold voltage of a p-conducting MOSFET.

With the power component in the off state, if a space charge zone forms proceeding from the pn junction between the body zone 60 and the drift zone 40 in the component and the potential in the drift zone increases proceeding from the pn junction in the direction of the second terminal zone 30, the p-channel transistors of the discharge structure remain turned off, as a result of which the semiconductor zones 90A-90C are reliably floating with the power component in the off state. Consequently, the semiconductor zones 90A-90C can be connected to the body zone only when the power component is in the on state.

It goes without saying that the discharge structure in accordance with FIG. 14 can also be applied to diodes, in which case the electrode arranged directly adjacent to the first terminal zone (the electrode 96A in FIG. 4) overlaps the first terminal zone doped complementarily with respect to the drift zone in the case of a diode.

A further example of a discharge structure that prevents a negative potential at the field plates 50A-50C is illustrated in FIG. 15. In this case, provision is made for connecting the field plates 50A-50C at least in sections to the semiconductor zone 10 which is arranged below the drift zone 40 and is doped complementarily with respect to the drift zone 40. In the example, the insulation layer 52A-52C surrounding the field electrodes 50A-50C has cutouts in sections in the boundary region with respect to the semiconductor zone 10, through which cutouts sections 55A-55C of the field electrodes 50A-50C reach as far as said semiconductor zone 10 and are connected to the latter. More highly doped terminal zones 11A-11C which are of the same conduction type as the semiconductor zone 10 are preferably present in the connection region.

If, in a manner that is not illustrated, the semiconductor zone 10 does not directly join the insulation layer 52A-52C, it is possible to provide connecting zones in the semiconductor body 100 which connect the semiconductor zone 10 and the field electrodes 50A-50C.

A method for fabricating a field electrode 50 arranged in the drift zone 40, which field electrode makes contact with the complementarily doped semiconductor zone 10 lying below the drift zone 40 and is insulated from the drift zone 40 by an insulation layer 52, is explained below with reference to FIGS. 16 and 17.

The method explained below is suitable in particular for fabricating field electrodes 50 whose thickness varies in the lateral direction. One example of such a field electrode is a field electrode 50 that is wedge-shaped in plan view, as is illustrated in FIG. 16a, or a field electrode that is T-shaped in plan view, as is illustrated for example in FIG. 16b.

Figure 16:
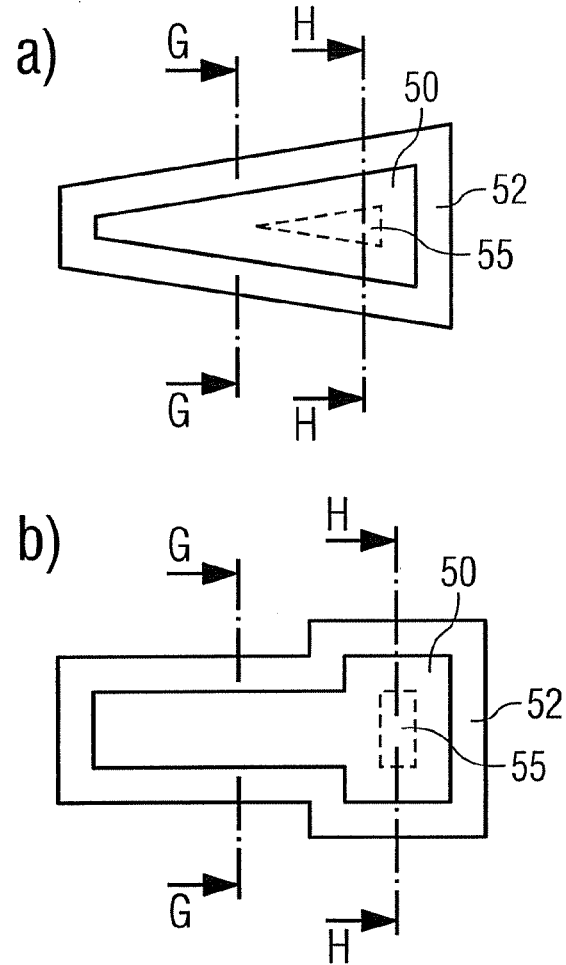
FIG. 16 illustrates a plan view of preferred geometries for field electrodes in the case of the semiconductor component illustrated in FIG. 15.
Figure 17:
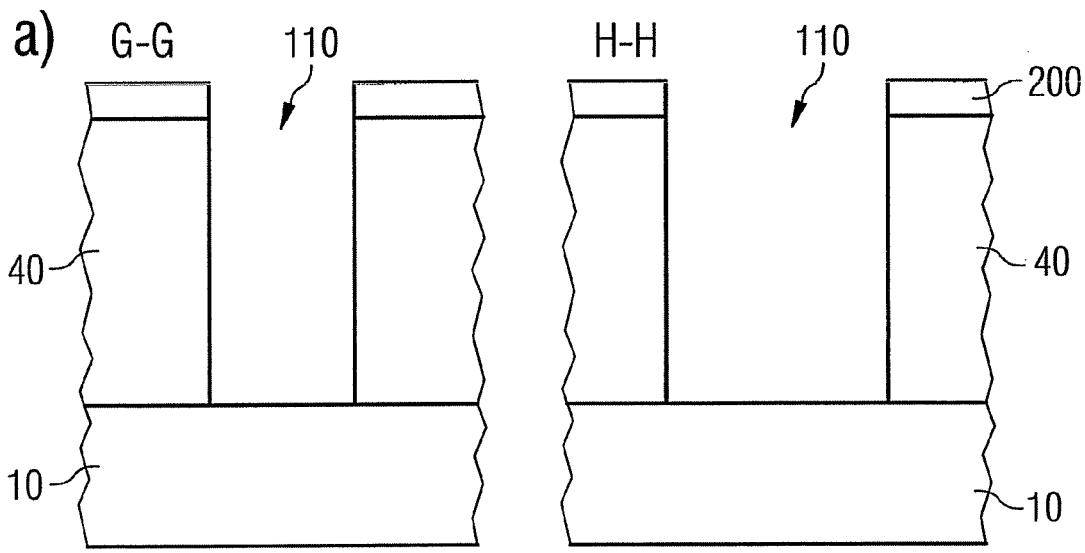
FIG. 17 illustrates a method for fabricating field electrodes in accordance with FIG. 16.

In the case of the method for fabricating such field electrodes 50, referring to FIG. 17a, firstly a trench 110 extending into the semiconductor body in the vertical direction proceeding from the front side 101 is fabricated, which trench is for example wedge-shaped or T-shaped in plan view in accordance with the explanation relating to FIG. 16. FIG. 17a shows a cross section through said trench in the cross-sectional planes G-G and H-H illustrated in FIG. 16. In this case, the sectional area G-G lies in a region of the trench which is hereinafter referred to as the region having a normal trench width and in which no terminal contact with respect to the underlying semiconductor zone 10 is produced, while the sectional area H-H lies in a region of the trench which is hereinafter referred to as the region having an enlarged trench width in which the terminal contact 55 with respect to the underlying semiconductor zone 10 is produced.

The trench 110 is fabricated for example by means of an etching method using a hard mask 200 applied to the front side 101.

Referring to FIG. 17b, the fabrication of the trench 110 is followed by the application of an insulation layer or dielectric layer to the side walls and the bottom of the trench 110. For this purpose, by way of example, an insulation layer 252 is deposited onto the semiconductor body over the whole area, said insulation layer 252 at the side walls and at the bottom of the trench forming the insulation layer 52 that surrounds the later field electrode 50.

Referring to FIG. 17c, an electrode layer 250 is subsequently deposited onto said insulation layer 252, said electrode layer forming a part of the later field electrode 50. Said electrode layer 250 is composed of a highly doped polysilicon, for example. The thickness of said deposited electrode layer 250 is in this case chosen such that the trench present above the insulation layer 252 in the trench region having a normal width (cross section G-G) is completely filled. This is achieved by virtue of the fact that the thickness of the deposited electrode layer 250 is greater than half the width of the trench remaining above the insulation layer 252. By contrast, in the region having an enlarged trench width (cross section H-H), a cutout extending in the vertical direction of the semiconductor body remains after the deposition of the electrode layer 250.

FIG. 17d illustrates a cross section through the semiconductor body after carrying out further method steps in which the electrode layer 250 and the insulation layer 252 were etched anisotropically. In the region having a normal trench width (cross section G-G), this has the effect that the electrode layer 250 and the insulation layer 252 are removed above the front side 101 of the semiconductor body down to the hard mask layer 200 and are, if appropriate, etched back somewhat in the region of the trench. In the region having an enlarged trench width (cross section H-H), too, the electrode layer 250 and the insulation layer 252 are removed above the hard mask layer 200 and, if appropriate, etched back somewhat in the region of the trench side walls. In addition, in this region, the electrode layer 250 and the insulation layer 252 are removed at the bottom of the trench that remains after the deposition of the electrode layer 250, as a result of which the trench reaches as far as the underlying semiconductor zone 10 after the conclusion of the etching process.

In a manner that is not specifically illustrated, this trench is subsequently filled with electrode material in order to complete the field electrode 50 illustrated in plan view in FIGS. 16a, 16b. If appropriate, before filling this trench that remained after the deposition of the electrode layer 252 and reaches as far as the semiconductor zone 10 after the etching process, at the bottom of said trench, a highly doped semiconductor zone 11 of the same conduction type of the semiconductor zone 10 is produced in order to achieve a low-impedance connection of the field electrode 50 to the underlying semiconductor zone 10. The field electrode is completed after this trench that remained is filled with an electrode material, for example a highly doped polysilicon.

The component concept explained above in which at least one field electrode 50A-50C is arranged in the drift zone 40 of the component, said field electrode being connected to a semiconductor zone 90A-90C arranged in floating fashion in the drift zone 40, is suitable, when applied to MOSFETs, in particular for such MOSFETs in which the gate electrode 70 is arranged in a trench extending into the semiconductor body in the vertical direction, which has already been explained with reference to FIGS. 4 and 5.

FIG. 18a illustrates in side view a cross section through such a component with a gate electrode 70 extending into the semiconductor body in the vertical direction, said gate electrode being insulated from the semiconductor body by an insulation layer 71. FIG. 18b shows this component in cross section through the sectional plane E-E illustrated in FIG. 18a. In the case of this component, the first terminal zone 20 likewise extends into the depth of the semiconductor body, the penetration depth of the first terminal zone 20 preferably approximately corresponding to the penetration depth of the gate electrode 70. The body zone 60 surrounding the first terminal zone 20 reaches into the semiconductor body to a corresponding depth, the body zone 60 completely surrounding the first terminal zone 20. In the exemplary embodiment, the body zone 60 reaches through the drift zone 40 right into the underlying semiconductor substrate 10 doped complementarily with respect to the drift zone 40. However, the penetration depth of the gate electrode 70, of the first terminal zone 20 and of the body zone 60 may also be chosen such that the body zone 60 ends in the drift zone 40 above the semiconductor substrate 10.

As can be seen from the sectional illustration in FIG. 18b, the gate electrode 70 reaches in the lateral direction of the semiconductor body from the first terminal zone 20 through the body zone 60 right into the drift zone 40, in which case, when a suitable drive potential is applied to the gate electrode 70, a conducting channel forms in the body zone 60 adjacent to the gate electrode 70 between the first terminal zone 20 and the drift zone 40.

Figure 6:
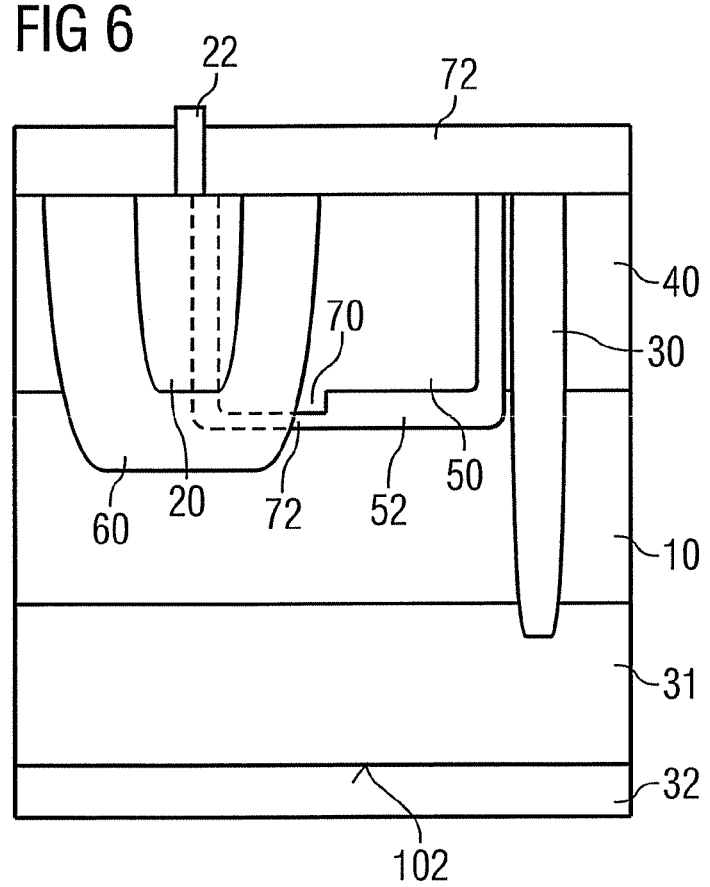
FIG. 6 illustrates a component in accordance with a further modification of a semiconductor component in accordance with FIG. 4.
Figure 19A:
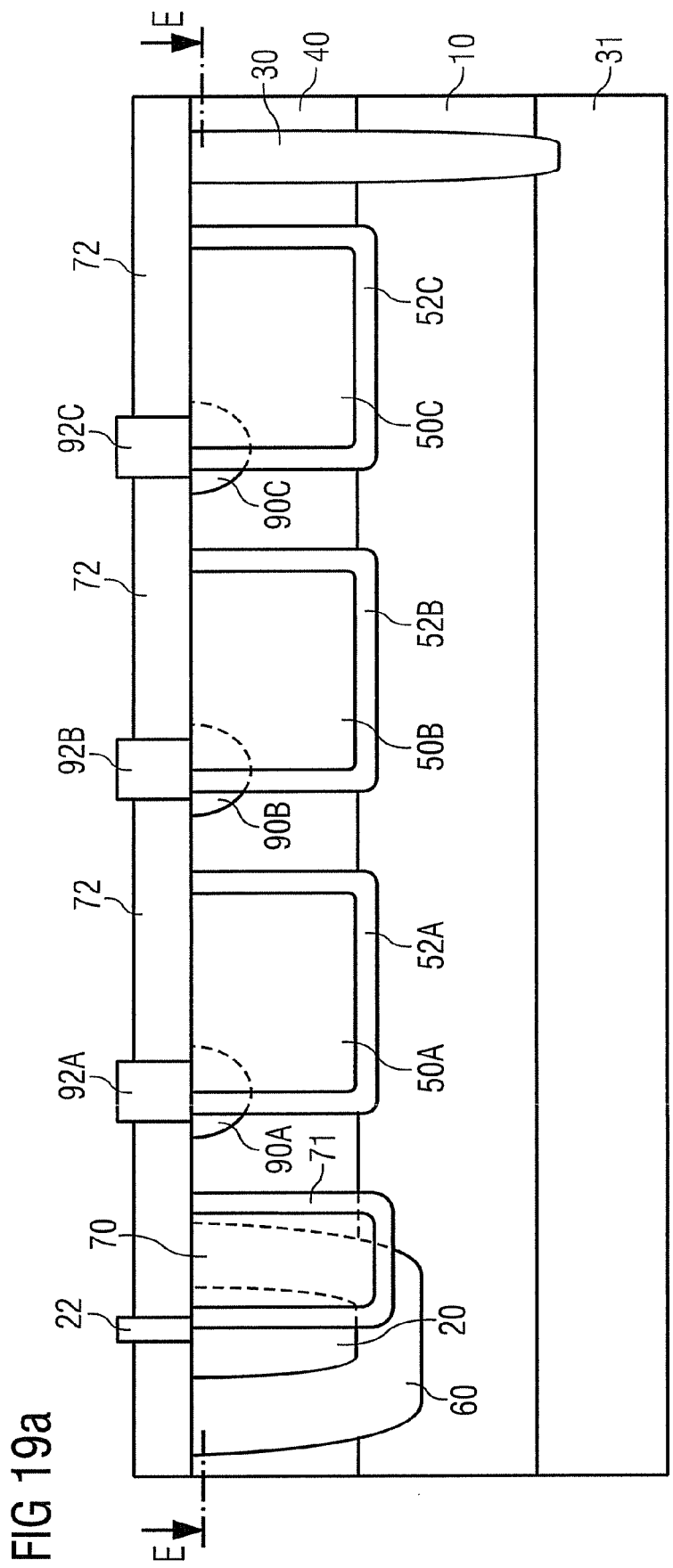
FIG. 19 illustrates a modification of the component in accordance with FIG. 18.

FIGS. 19a and 19b illustrate, in side view in cross section and in cross section through a sectional plane E-E depicted in FIG. 19a, a semiconductor component that is modified with respect to the component in accordance with FIG. 6, this semiconductor component having a plurality of field electrodes 50A-50C arranged in the drift zone 40, said field electrodes being connected to floating semiconductor zones 90A-90C, and the second terminal zone 30 of which semiconductor component is connected to a heavily doped semiconductor zone 31 arranged in the region of the rear side 102 and of the same conduction type as the second terminal zone 30. In this exemplary embodiment, the gate electrode 70 extends into the semiconductor body in the vertical direction proceeding from the front side 101.

It should be pointed out that the discharge structures explained above with reference to FIGS. 13 to 17 can, of course, also be applied to the components in accordance with FIGS. 18 and 19.

The lateral semiconductor components explained above are distinguished by the fact that the first terminal zone 20 is arranged at a distance from the second terminal zone 30 in the lateral direction of the semiconductor body 100, a lateral component also being present in this sense when the second terminal zone 30 is connected via a low-impedance connection to a terminal zone 32 in the region of the rear side of the semiconductor body (cf. FIGS. 6 and 19).

Semiconductor bodies or semiconductor chips are usually rectangular or square in plan view. In the case of lateral power components, it is desirable here to provide one of the terminal zones, for example the first terminal zone, in the inner region of the semiconductor body and to arrange the other of the terminal zones, for example the second terminal zone, in the region of an edge of the semiconductor body such that said second terminal zone, in a plan view of the semiconductor body, surrounds the first terminal zone and the drift zone essentially annularly. The advantage of this procedure is that it is possible to dispense with complicated edge terminations of the component.

FIG. 20 illustrates a detail from a cross section through a semiconductor body 100 in the lateral direction in which a power transistor with a field plate structure that has already been explained with reference to FIG. 7 is integrated. In this case, the first terminal zone 20 is provided in the inner region of the semiconductor body 100 and the second terminal zone 30 is provided in the region of an edge 104 of the semiconductor body 100. A first edge side of the (in plan view) rectangular semiconductor body is designated by 104_1 in FIG. 20 and a second edge side running perpendicular to the first edge side is designated by 104_2 in FIG. 20. The two edge sides 104_1, 104_2 adjoin one another at a corner 103. In FIG. 20, the reference symbol 40_1 designates a first drift zone section, which runs along the first edge side 104_1 and in which trenches with field electrodes 50A-50C arranged therein, which are formed in elongate fashion in plan view, are present in the manner already explained above. These field electrodes 50A-50C extend in their longitudinal direction in each case in the direction of the shortest connection between the first and second terminal zones 20, 30 and thus essentially run perpendicular to the first edge side 104_1. The reference symbol 40_2 correspondingly designates a second drift zone section, which runs along the second edge side 104_2 and in which field electrodes 50A-50C are arranged. These field electrodes of the second drift zone section run in their longitudinal direction essentially perpendicular to the field electrodes of the first section 40_1.

The field electrodes 50A-50C in the drift zone sections 40_1, 40_2 running along the edge sides may have any desired geometry of the geometries explained above. All measures explained above with regard to field electrodes, in particular the presence of a discharge structure, can also be applied to the field electrode structure in the drift zone sections 40_1, 40_2 running along the side areas.

When the component is switched on, the main load current of the power transistor illustrated as a detail flows essentially perpendicular to the edge sides of the semiconductor body 100 along the field electrode structure in the first and second drift zone sections, and also in further, third and fourth drift zone sections (not illustrated) which extend along the two further edge sides of the semiconductor body.

A corner region is present between the drift zone sections 40_1, 40_2, said corner region being formed by virtue of the fact that the pn junction between the drift zone 40 and the second terminal zone or between the body zone and the drift zone runs in angled fashion, that is to say forms a corner. In this corner region, the maximum permissible voltage loading without particular measures would be significantly less than the maximum permissible voltage loading in the adjoining drift zone sections 40_1, 40_2.

Suitable possibilities for raising the dielectric strength in such a corner region are explained below with reference to FIG. 20 and the further FIGS. 21 to 25.

In the case of the exemplary embodiment illustrated in FIG. 20, provision is made for providing a trench 120 in the corner region, said trench having an L structure in plan view and extending along the drift zone sections 40_1, 40_2.

The trench is filled with a dielectric 121, for example an oxide. The trench 120 preferably has the same depth as the trenches comprising the field electrodes 50A-50C; a larger depth is also possible. The trench 120 with the dielectric 121 is in this case completely surrounded by the semiconductor material forming the drift zone 40_1, 40_2. The remaining region of the corner is formed by the second terminal zone 30 in the case of the example in accordance with FIG. 20.

The semiconductor region between the trench 120 and the trenches with field electrodes 50A-50C should be fully depleted of charge carriers in the off-state case. For this purpose, the distance d3 between said trench 120 and an adjacent trench with a field plate arranged therein preferably corresponds to half the distance d2 between two trenches in the drift zone sections 40_1, 40_2.

Figure 21:
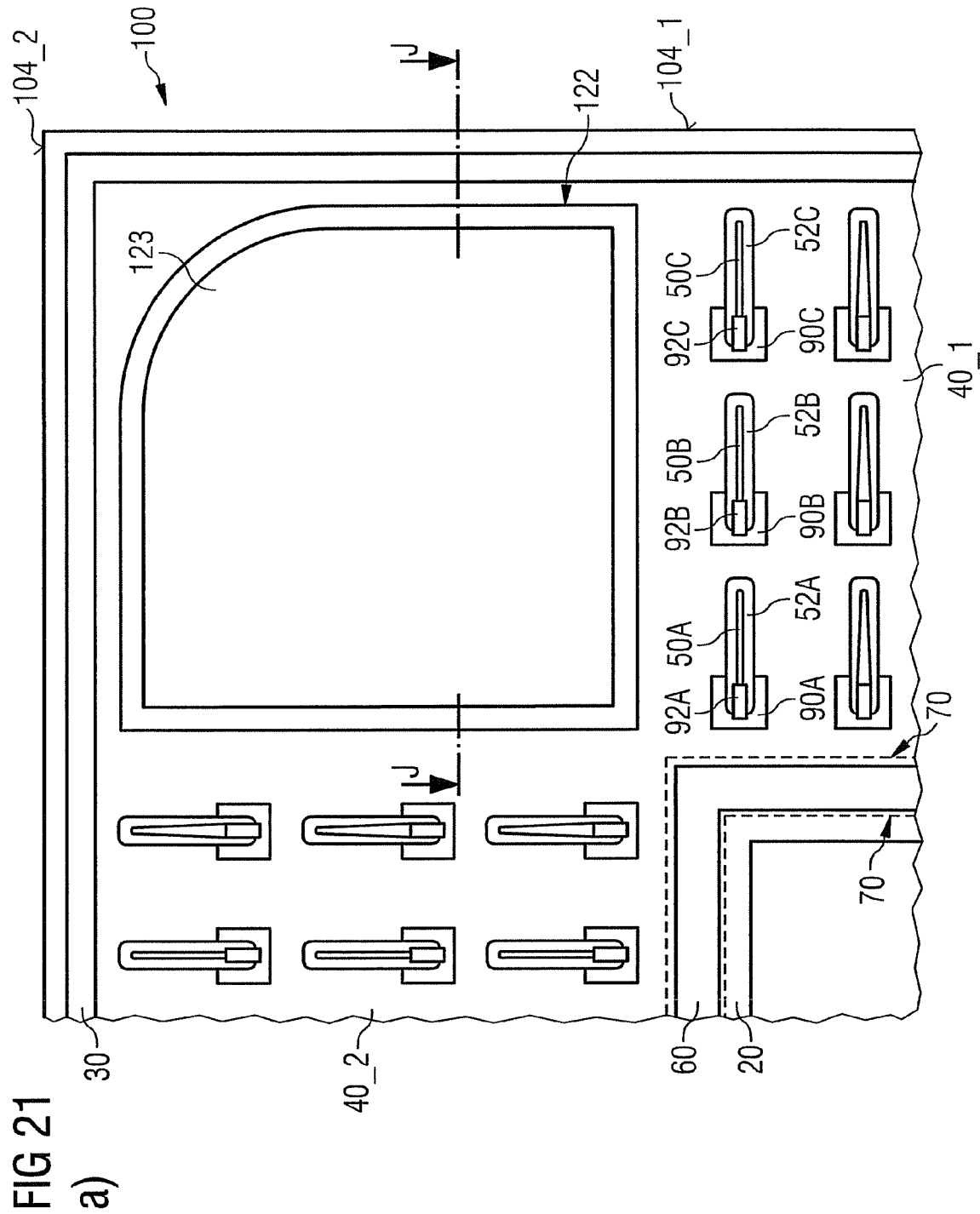
FIG. 21 illustrates a detail from a corner region of a lateral semiconductor component according to the invention, with a corner structure in accordance with a second exemplary embodiment.
Figure 21:
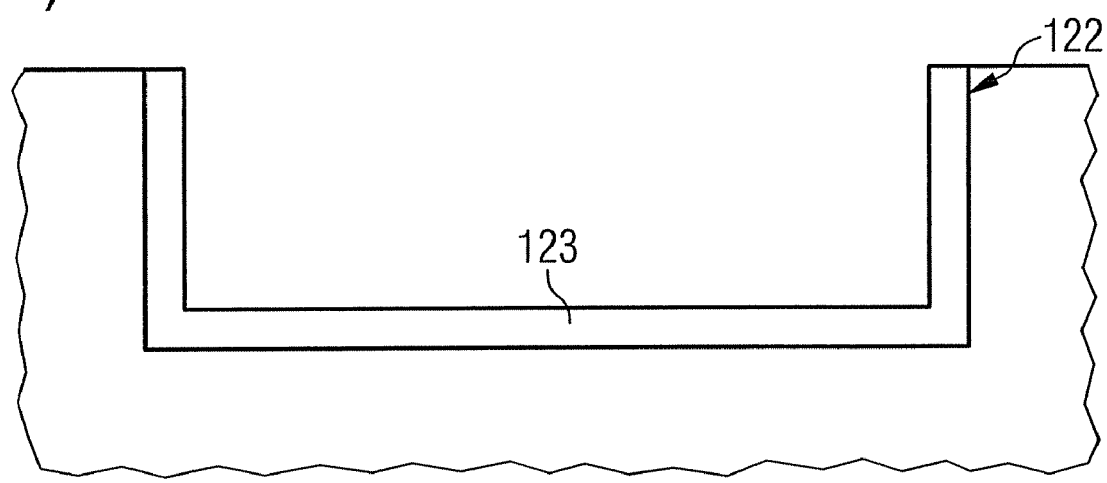

An alternative structure for the corner region of the component is illustrated in FIG. 21. In this case, FIG. 21a illustrates a plan view of the component and FIG. 21b illustrates a cross section through the sectional plane J-J illustrated in FIG. 21. In the case of this exemplary embodiment, a trench extending into the semiconductor body in the vertical direction is formed in the corner region of the component, said trench essentially occupying the entire corner region within the semiconductor zone forming the drift zone sections 40_1, 40_2. In this case, the bottom and the side areas of said trench 122 are covered by a dielectric layer 123, which can be seen in particular from the cross section illustrated in FIG. 21b. A semiconductor oxide, in particular, is suitable as covering layer 123 of said trench 121. However, other materials such as nitrides or imides, for example, are also suitable. The trench may extend into the semiconductor body in the vertical direction more deeply than the trenches of the field electrode structure, but may also be embodied slightly shallower than the trenches of the field electrode structure.

Figure 22:
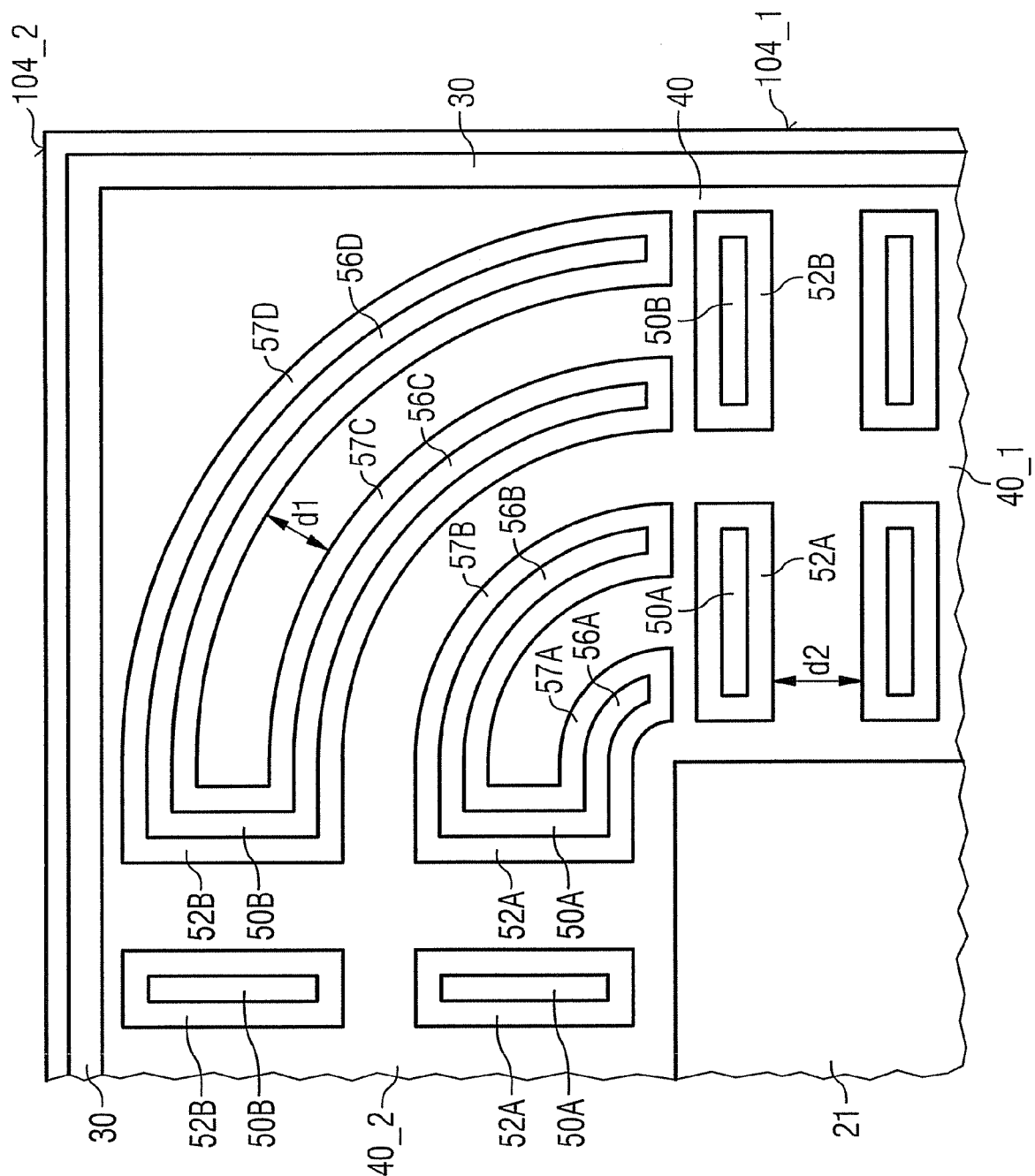
FIG. 22 illustrates a detail from a corner region of a lateral semiconductor component according to the invention, with a corner structure in accordance with a third exemplary embodiment.

A further exemplary embodiment of a structure of a component corner region is illustrated in FIG. 22. In the case of this exemplary embodiment, the semiconductor material, n-doped in the case of an n-channel MOSFET, which forms the drift zone sections 40_1, 40_2 extends right into the corner region. Field electrodes 56A-56D which are respectively insulated from the semiconductor body by insulation layers 57A-57D are present in said corner region. Said field electrodes 56A-56D run essentially in the shape of circle arcs and essentially perpendicular to the field electrodes 50A, 50B arranged in trenches in the first and second drift zone sections 40_1, 40_2 with the insulation layers 52A, 52B surrounding said field electrodes.

The field electrodes 56A-56D arranged in the corner region are connected at one end to the field electrodes 50A, 50B which are arranged in one of the drift zone sections 40_2 and run perpendicular to the field electrodes 56A-56D in the shape of circle arcs. At the other end, the field electrodes 56A-56D running in the shape of circle arcs end at a distance from the field electrodes 50A, 50B arranged in the respective drift zone section 40_1, as a result of which the semiconductor region (mesa region) arranged between the field electrodes 56A-56D running in the shape of circle arcs is connected to the semiconductor region 40_1 which surrounds the field electrodes 50A, 50B with the insulation layers 52A, 52B thereof in said drift zone section.

In a manner that is not illustrated, the field electrodes 56A-56D may also be connected to floating p-type regions in a manner corresponding to the field electrodes 50A-50C in the drift zone sections, it then being possible to dispense with a connection of the electrodes to the field electrodes 50A-50C.

The perpendicular distance d1 between two trenches with field electrodes 56A-56D in the corner region is preferably chosen such that it corresponds to the distance d2 between two trenches with field electrodes in the drift zone sections 40_1, 40_2 that run transversely with respect to the current flow direction or transversely with respect to a voltage rise. In principle, the width of that section of the (n-doped) semiconductor zone 40 which remains between the trenches with field electrodes should correspond to the width of corresponding semiconductor sections (mesa regions) in the drift zone sections 40_1, 40_2 or be smaller, in order to achieve the same dielectric strength in the corner region as in the drift zone sections. This also applies to the corner structures for field electrodes that are explained below with reference to FIGS. 23 to 25.

In the cross section that is not illustrated, the geometry of the field electrodes 56A-56D in the corner region may correspond to the geometry of the field electrodes in the drift zone sections 40_1, 40_2. The field electrodes 56A-56D extend in the corner region preferably just as far into the depth as the field electrodes 50A-50C in the drift zone sections.

Figure 23:
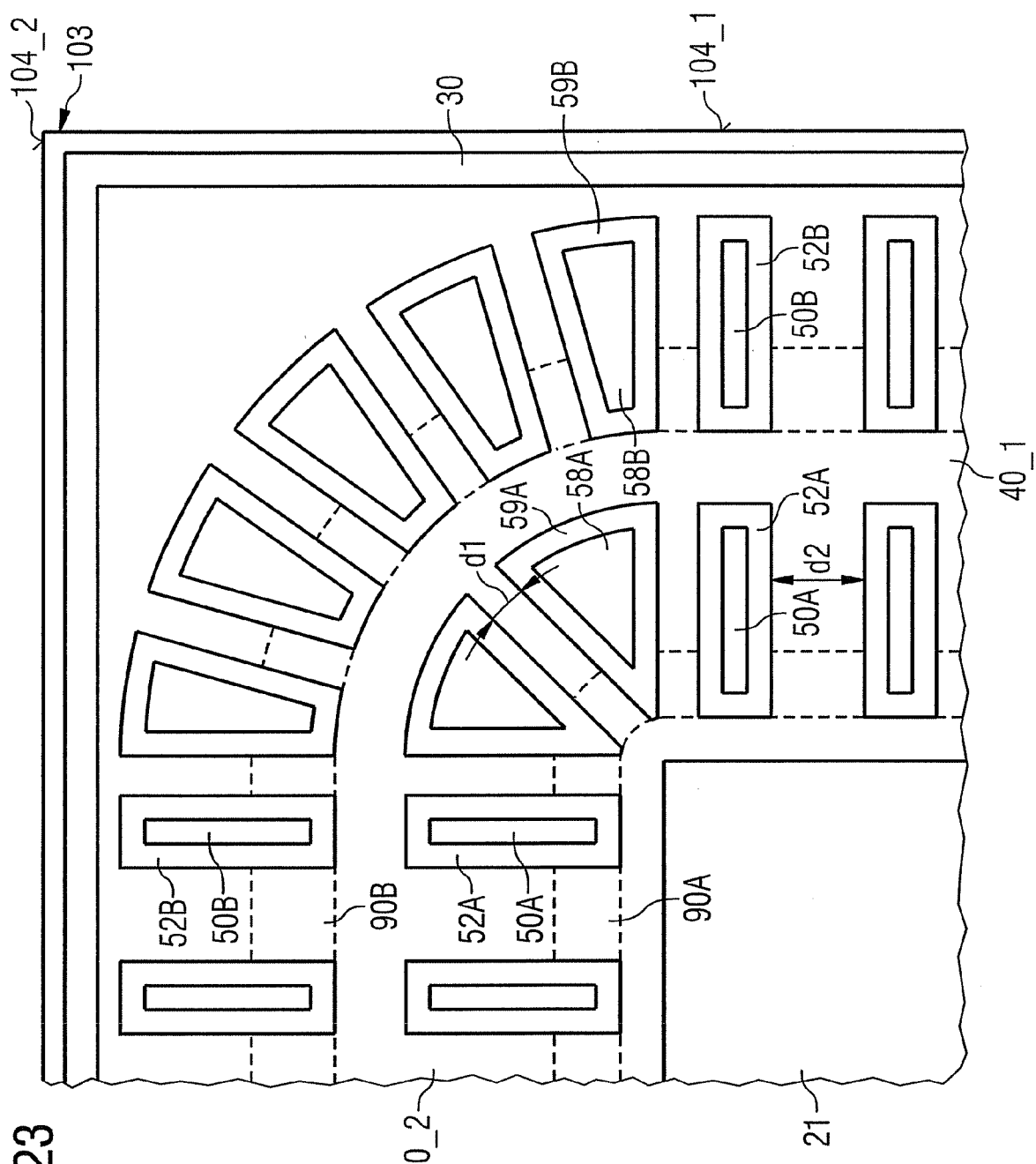
FIG. 23 illustrates a detail from a corner region of a lateral semiconductor component according to the invention, with a corner structure in accordance with a fourth exemplary embodiment.

A further exemplary embodiment of a corner structure is illustrated in FIG. 23.

In the case of this exemplary embodiment, field electrodes 58A, 58B which are formed in the form of segments of an annulus and are respectively surrounded by an insulation layer 59A, 59B are present in the corner region. The width d1 of the n-doped mesa region between two adjacent trenches with field electrodes 58A, 59A in the corner region in this case preferably corresponds to the width d2 of the mesa region between two trenches in the drift zone sections 40_1, 40_2.

In the example in accordance with FIG. 23, the number of field electrodes 58A, 58B that succeed one another in the lateral direction proceeding from the first terminal zone 60 to the second terminal zone 30 corresponds to the number of field electrodes that succeed one another in said lateral direction in the drift zone sections 40_1, 40_2.

Figure 24:
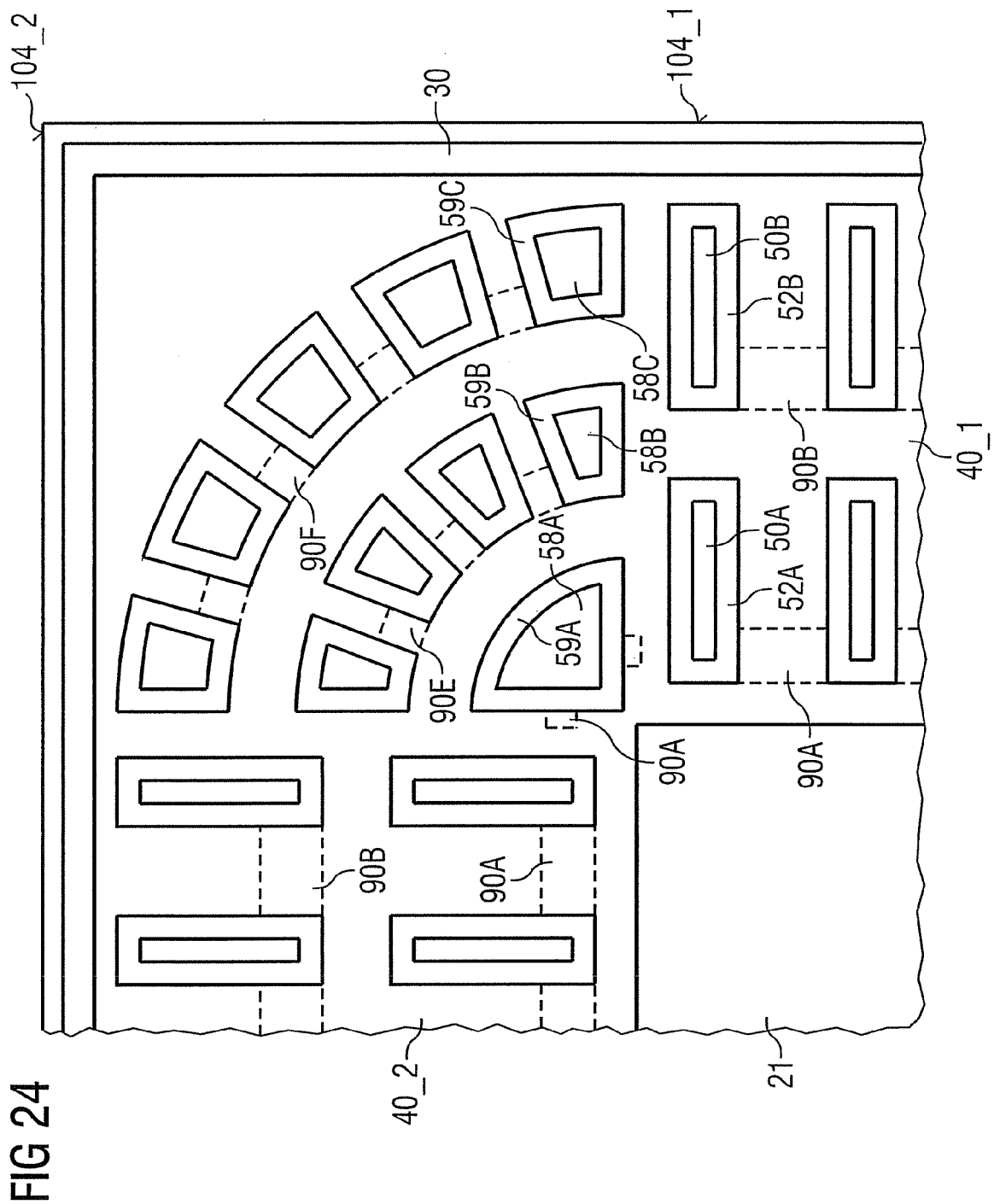
FIG. 24 illustrates a detail from a corner region of a lateral semiconductor component according to the invention, with a corner structure in accordance with a fifth exemplary embodiment.

Referring to FIG. 24, however, it is possible for more field electrodes to be arranged in a manner succeeding one another in the direction from the first terminal zone 20 to the second terminal zone 30 in the corner region. While the field electrode structure in the drift zone sections 40_1, 40_2 along the side areas in the example in accordance with FIG. 24 has two field electrodes succeeding one another in the direction from the first terminal zone 60 to the second terminal zone 30, three successive field electrodes 58A, 58B, 58C are arranged in the corner region here.

In the case of the component structures in accordance with FIGS. 23 and 24, the field electrodes 58A-58C arranged in the corner region are connected to the drift zone 40 via semiconductor zones doped complementarily with respect to the drift zone 40, which has already been explained comprehensively with reference to FIG. 7 ff. for the field electrodes 50A, 50B of the drift zone sections 40_1, 40_2. These complementary semiconductor zones are depicted by dashed lines and designated by the reference symbols 90A and 90B in FIG. 23 and by the reference symbols 90D-90F in FIG. 24. The field electrodes of the corner structures and the field electrodes in the drift zone sections may, in particular, be connected to common floating semiconductor zones, which is illustrated for example in FIG. 23.

The depth of the trenches in which the field electrodes 58A-58C are arranged in the corner region preferably corresponds to the depth of the trenches with the field electrodes 50A, 50B in the drift zone sections 40_1, 40_2.

Figure 25:
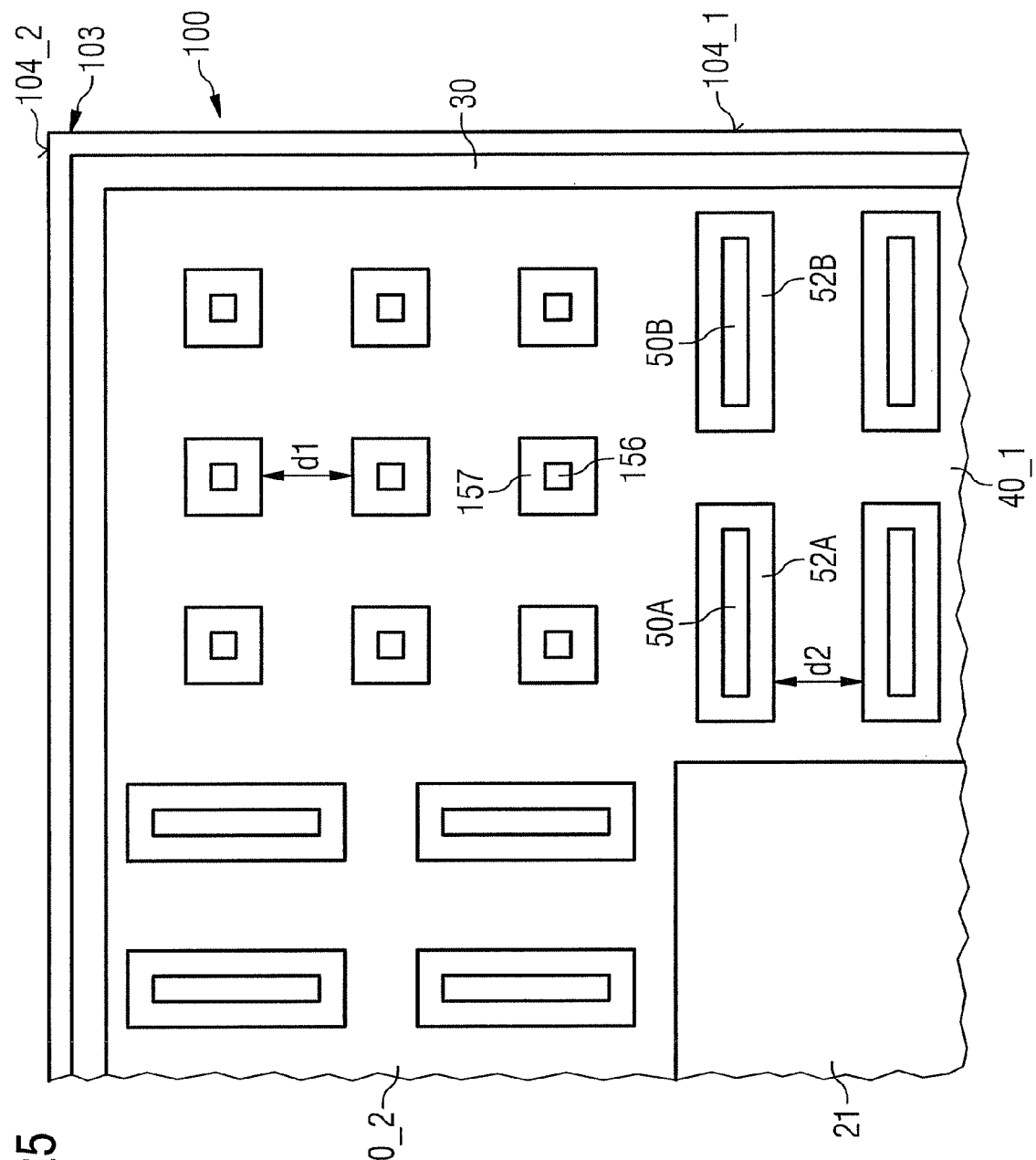
FIG. 25 illustrates a detail from a corner region of a lateral semiconductor component according to the invention, with a corner structure in accordance with a sixth exemplary embodiment.

A further exemplary embodiment of a corner structure is illustrated in FIG. 25. In the case of this exemplary embodiment, a grid with trenches that are essentially square in plan view is arranged in the corner region, in which trenches there are arranged in each case in the vertical direction of the semiconductor body 100 elongate field electrodes 156 surrounded by an insulation material 157. In this case, the distance between two adjacent field electrodes thereof preferably corresponds to the distance between two adjacent field electrodes in the regions of drift zone sections 40_1, 40_2 adjoining the corner region.

In a manner that is not specifically illustrated, at least some field electrodes of the corner region are preferably connected to floating p-doped semiconductor zones, for example together with field electrodes of the drift zone sections 40_1, 40_2. However, the field electrodes of the corner region may also be connected to dedicated floating semiconductor zones.

The corner structures explained with reference to FIGS. 20 to 25 can be applied to any desired power components with a drift structure having field electrodes, in particular to power MOSFETs, diodes, Schottky diodes, IGBTs and JFETs. In order to illustrate this, the components in FIGS. 20 and 21 are formed as MOSFETs having a source zone 20 as first terminal zone and a body zone doped complementarily with respect to source zone 20 and drift zone 40, while the components in accordance with FIGS. 22 to 25 are realized as diodes in which the first terminal zone 21 is doped complementarily with respect to the drift zone and the second terminal zone 30.

The previous explanation of the corner structures has assumed that the corner region is arranged in the region of a corner 103 of the semiconductor body. As explained below, the corner structures explained can also be employed in the inner region of a semiconductor body.

Figure 26:
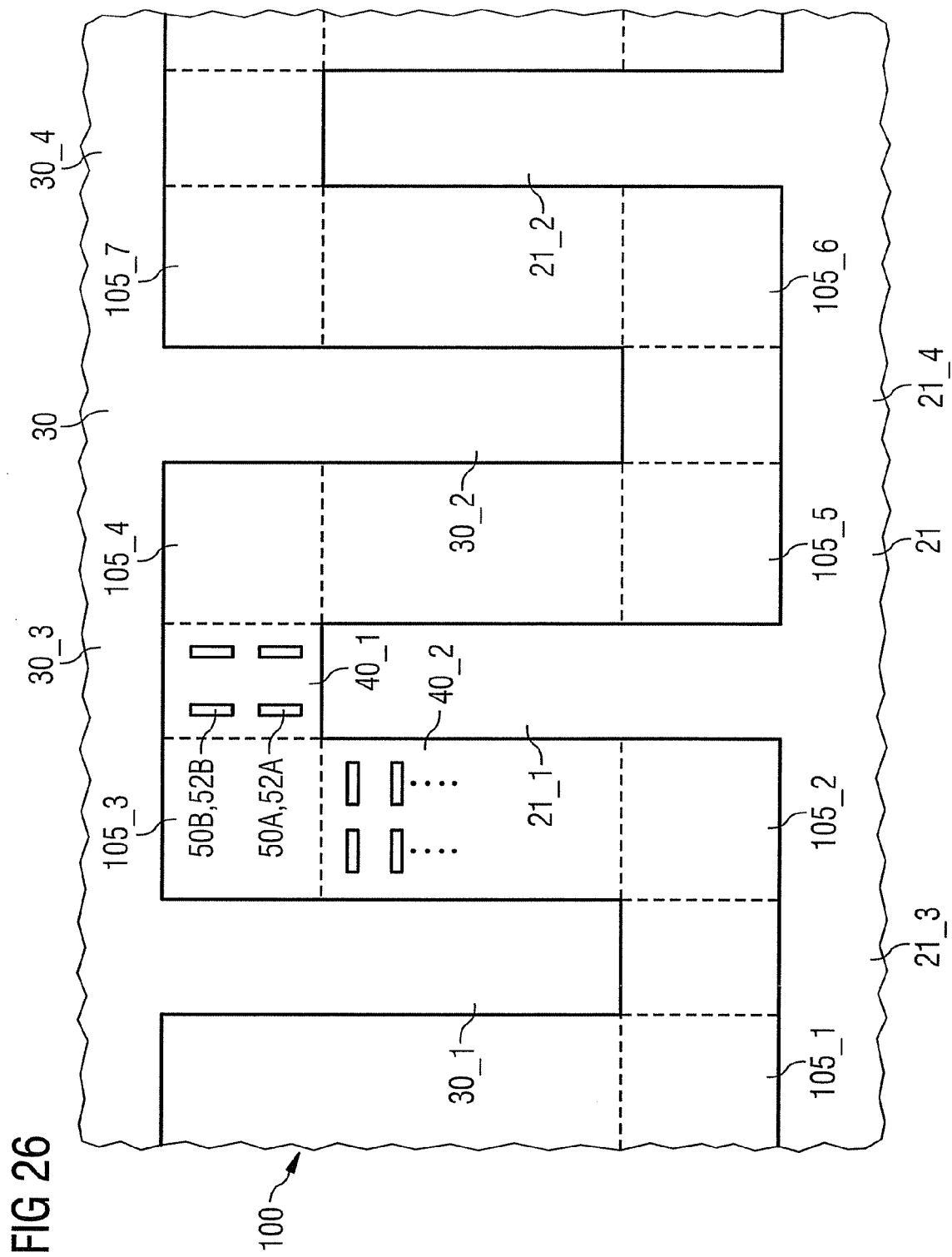
FIG. 26 illustrates a plan view of a semiconductor component having a first and second terminal zone with an intermeshing comblike structure.

In order to enlarge the active component area, the first terminal zone 21 and the second terminal area 30 are often formed such that they have a comblike structure in plan view, as is illustrated by way of example in FIG. 26. In this case, "teeth" 21_1, 21_2 of the comblike structure of the first terminal zone engage between "teeth" 30_1, 30_2 of the comblike structure of the second terminal zone 30, the drift zone 40 running in meandering fashion between the opposite comb structures of the first and second terminal zones 21, 30.

In this case, field electrodes 50A, 50B surrounded by an insulation layer 52A, 52B are arranged in sections of the drift zone 40 which run between parallel-running sections of the first and second terminal zones. In the example in accordance with FIG. 26, these are for example the first drift zone section 40_1 and the second drift zone section 40_2. In this case, the first drift zone section 40_1 is arranged between the section 30_3 of the first terminal zone 30 and the section 21_1 of the first terminal zone 21 which run parallel in sections, and the second drift zone section 40_2 is formed between the section 30_1 of the first terminal zone 30 and the section 21_1 of the second terminal zone 21 which run parallel in sections.

Corner regions of the drift zone are present at all points where no parallel-running sections of the first and second terminal zones 21, 30 lie opposite one another in a manner directly separated by the drift zone or where junction regions (edges) between one of the first and second terminal zones 21, 30 and the drift zone 40 run in angled fashion. These corner regions are illustrated by dashed lines in FIG. 26 and designated by 10_1 to 105_7. All these corner regions 105_1-105_7 are in each case adjoined by two drift zone sections in which field electrodes 50A-50B are arranged, for reasons of clarity the illustration showing such field electrodes only in the first and second drift zone sections 40_1, 40_2 adjoining the corner region 105_3. Said corner region 105_3 is formed by virtue of the fact that the junction between the second terminal zone 30 and the drift zone 40 runs in angled fashion (at an angle of approximately 90° in the example).

The field electrode structure in the drift zone sections, for example the sections 40_1, 40_2 which are formed between two parallel-running sections of the first and second terminal zones 21, 30, may be formed in any desired manner in accordance with the explanations regarding FIGS. 1 to 19.

The explanations concerning corner structures given with reference to FIGS. 20 to 25 apply correspondingly to the component structure in the corner regions 105_1-105_7. In these corner regions, in order to increase the dielectric strength, it is thus possible to provide for example trenches filled with a dielectric (cf. FIGS. 20 and 21), or field electrodes in the form of annuli (cf. FIG. 22), in the form of annulus segments (cf. FIGS. 23 and 24), or field electrodes with a square cross section in plan view (cf. FIG. 25).

The invention claimed is:

1. A semiconductor component comprising:
a semiconductor body including a first side and a second side;
a drift zone, which is arranged in the semiconductor body below the first side and extends in a first lateral direction of the semiconductor body between a first terminal zone and a second terminal zone;
at least one floating semiconductor zone disposed in a floating fashion in the drift zone between the first and second terminal zones; and
at least one field electrode, which is arranged in the drift zone, extends into the drift zone proceeding from the first side and is insulated from the semiconductor body by an insulating, layer,
wherein the at least one field electrode is formed in plate-type fashion and extends in its longitudinal direction along the drift zone between the first terminal zone and the second terminal zone and is electrically coupled to the at least one floating semiconductor zone so as to be electrically coupled to the drift zone, and
wherein the plate-type field electrode tapers in a plane perpendicular to the first side in a vertical direction of the semiconductor body proceeding from the first side toward the second side.

2. The semiconductor component of claim 1, comprising wherein the thickness of an insulation layer surrounding the at least one field plate increases or decreases in the first lateral direction.

3. The semiconductor component of claim 1, comprising wherein the at least one field electrode is coupled to one of the terminal zones.

4. The semiconductor component of claim 1, comprising wherein a plurality of field electrodes arranged at a distance from one another in the first lateral direction are arranged in the drift zone between the first terminal zone and the second terminal zone.

5. The semiconductor component of claim 1, comprising wherein the at least one floating semiconductor zone is doped with a conduction type complimentary to the drift zone.

6. The semiconductor component of claim 1, comprising wherein the at least one floating semiconductor zone is doped by a same conduction type as the drift zone, but more heavily relative to the drift zone.

7. The semiconductor component of claim 1, comprising wherein the doping of the drift zone varies in the vertical direction of the component.

8. The semiconductor component of claim 1, comprising wherein the effective doping of the drift zone is locally increased or reduced at least one position.

9. The semiconductor component of claim 1, comprising wherein the second terminal zone extends into the semiconductor body in the vertical direction and makes contact with a semiconductor zone of the same conduction type in the region of the second side of the semiconductor body.

10. The semiconductor component of claim 1, formed as a diode, the first and second terminal zones being doped complementarily with respect to one another.

11. The semiconductor component of claim 1, comprising wherein the semiconductor component comprises a transistor.

12. A semiconductor component comprising:
a semiconductor body including a first side and a second side;
a drift zone, which is arranged in the semiconductor body below the first side and extends in a first lateral direction of the semiconductor body between a first terminal zone and a second terminal zone;
a plurality of floating semiconductor zones disposed in a floating fashion and at a distance from one another in the drift zone; and
a plurality of field electrodes arranged in the drift zone, each of which extends into the drift zone proceeding from the first side and is configured in a manner electrically insulated from the semiconductor body, wherein at least two field electrodes are present which are arranged at a distance from one another in a second lateral direction running essentially perpendicular to the first lateral direction,
wherein each field electrode tapers in a plane in the second lateral direction and in a vertical direction of the semiconductor body proceeding from the first side toward the second side and is electrically coupled to a corresponding one of the floating semiconductor zones so as to be electrically coupled to the drip zone.

13. The semiconductor component of claim 12, comprising wherein the distance between the at least two field electrodes that are arranged adjacent is reduced locally.

14. The semiconductor component of claim 13, comprising wherein the at least two field electrodes are formed in plate-type fashion, at least one of the field electrodes being arranged obliquely relative to the first lateral direction in order to obtain a distance between the at least two adjacent field plates that varies in the first lateral direction.

15. The semiconductor component of claim 13, comprising wherein at least one of the adjacent field electrodes has at least one projection extending in the second lateral direction.

16. A semiconductor component comprising:
a semiconductor body including a first side and a second side;
a drift zone, which is arranged in the semiconductor body below the first side and extends in a first lateral direction of the semiconductor body between a first terminal zone and a second terminal zone; and
at least one field electrode, which is arranged in the drift zone, extends into the drift zone proceeding from the first side and is configured in a manner electrically insulated from the semiconductor body; and
at least one floating semiconductor zone disposed in a floating fashion in the drift zone between the first and second terminal zones; and
the semiconductor component is formed as a field-effect transistor, in which the first terminal zone is of the same conduction type as the drift zone;
a complementarily doped channel zone is arranged between the first terminal zone and the drift zone; and a drive electrode insulated from the semiconductor body is present adjacent to the channel zone, wherein the at least one field electrode tapers in a plane perpendicular to the first lateral direction in a vertical direction of the semiconductor body proceeding from the first side toward the second side and is electrically coupled to the at least one floating semiconductor zone so as to be electrically coupled to the drift zone.

17. The semiconductor component of claim 16, comprising wherein the drive electrode is arranged above the first side of the semiconductor body.

18. The semiconductor component of claim 16, comprising wherein the drive electrode extends into the semiconductor body in the vertical direction.

19. The semiconductor component of claim 18, comprising wherein the at least one field electrode directly adjoins the drive electrode.

20. A semiconductor component comprising:
a semiconductor body including a first side and a second side;
a drift zone, which is arranged in the semiconductor body below the first side and extends in a first lateral direction of the semiconductor body between a first terminal zone and a second terminal zone;
a plurality of floating semiconductor zones arranged in a floating fashion in the drift zone between the first and second terminal zones; and
a plurality of field electrodes extending into the drift zone and arranged at a distance from one another in the first lateral direction in the drift zone between the first terminal zone and the second terminal zone, and
wherein each of the field electrodes are electrically coupled to a corresponding one of a plurality of floating semiconductor zones, the floating semiconductor zones being spaced at a distance from one another in the first lateral direction, so as to be coupled to different potential sources via the corresponding floating semiconductor zone.

* * * * *